US012805295B2

(12) United States Patent
Abedin et al.

(10) Patent No.: US 12,805,295 B2
(45) Date of Patent: Nov. 17, 2026

(54) FRONTSIDE-TO-BACKSIDE POWER VIA STRUCTURE WITH FORK SHEET TRANSISTOR

(71) Applicant: International Business Machines Corporation, Armonk, NY (US)

(72) Inventors: Minhaz Abedin, Delmar, NY (US); Ruilong Xie, Niskayuna, NY (US); Jingyun Zhang, Albany, NY (US); Kisik Choi, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 18/675,377

(22) Filed: May 28, 2024

(65) Prior Publication Data

US 2025/0372518 A1 Dec. 4, 2025

(51) Int. Cl.

| | |
|---|---|
| ***H10W 20/41*** | (2026.01) |
| ***H10D 30/43*** | (2025.01) |
| ***H10D 30/67*** | (2025.01) |
| ***H10D 62/10*** | (2025.01) |
| ***H10D 84/83*** | (2025.01) |

(52) U.S. Cl.

CPC .......... *H10W 20/427* (2026.01); *H10D 30/43* (2025.01); *H10D 30/6735* (2025.01); *H10D 30/6757* (2025.01); *H10D 62/121* (2025.01); *H10D 84/83* (2025.01)

(58) Field of Classification Search

None

See application file for complete search history.

(56) References Cited

U.S. PATENT DOCUMENTS

| | | | | |
|---|---|---|---|---|
| 9,570,395 | B1 | 2/2017 | Sengupta et al. | |
| 10,586,765 | B2 | 3/2020 | Smith et al. | |
| 10,636,739 | B2 | 4/2020 | Beyne et al. | |
| 10,700,207 | B2 | 6/2020 | Chen et al. | |
| 11,322,495 | B2 | 5/2022 | Vellianitis | |
| 2020/0105671 | A1 | 4/2020 | Lai et al. | |
| 2023/0095140 | A1 | 3/2023 | Xie et al. | |
| 2023/0139929 | A1 | 5/2023 | Xie et al. | |
| 2023/0187444 | A1 | 6/2023 | Yemenicioglu et al. | |
| 2023/0207551 | A1 | 6/2023 | Yemenicioglu et al. | |
| 2023/0207553 | A1 | 6/2023 | Xie et al. | |
| 2023/0275090 | A1* | 8/2023 | Tzeng | H10D 62/121 |
| 2023/0411468 | A1* | 12/2023 | Liaw | H10D 30/6735 |
| 2023/0420530 | A1 | 12/2023 | Xie et al. | |
| 2024/0079330 | A1* | 3/2024 | Hong | H10D 86/00 |
| 2024/0213243 | A1* | 6/2024 | Katakam | H10D 30/021 |

(Continued)

FOREIGN PATENT DOCUMENTS

| | | | | |
|---|---|---|---|---|
| CN | 115566043 A | * | 1/2023 | H10D 84/0151 |
| JP | 2023097349 A | * | 7/2023 | H10W 20/481 |

(Continued)

*Primary Examiner* — Michael Lebentritt

(74) *Attorney, Agent, or Firm* — Scully, Scott, Murphy & Presser, P.C.; Samuel Waldbaum

(57) ABSTRACT

A semiconductor device is provided that includes backside power delivery. The semiconductor device includes a fork sheet transistor located between a nanosheet transistor and a frontside-to-backside power via structure in which the frontside-to-backside power via structure contacts the fork sheet transistor and is electrically connected to a backside power distribution network.

20 Claims, 19 Drawing Sheets

(56) References Cited

U.S. PATENT DOCUMENTS

| | | | | |
|---|---|---|---|---|
| 2024/0266344 | A1* | 8/2024 | Lee | H10D 89/10 |
| 2024/0274679 | A1* | 8/2024 | Shin | H10D 30/6729 |
| 2025/0287645 | A1* | 9/2025 | Zhou | H10D 30/014 |
| 2025/0300033 | A1* | 9/2025 | Zhou | H10W 40/00 |
| 2025/0311319 | A1* | 10/2025 | Reboh | H10D 30/014 |
| 2025/0318238 | A1* | 10/2025 | Zhou | H10D 30/014 |
| 2025/0331292 | A1* | 10/2025 | Kenath | H10D 84/811 |

FOREIGN PATENT DOCUMENTS

| | | | | |
|---|---|---|---|---|
| WO | WO-2021075434 | A1 * | 4/2021 | B82Y 40/00 |
| WO | WO-2021125094 | A1 * | 6/2021 | H10D 62/118 |
| WO | WO-2021229740 | A1 * | 11/2021 | H10W 20/20 |

* cited by examiner

FRONTSIDE-TO-BACKSIDE POWER VIA STRUCTURE WITH FORK SHEET TRANSISTOR

BACKGROUND

The present application relates to semiconductor technology, and more particularly to a semiconductor device including a fork sheet transistor located between a nanosheet transistor and a frontside-to-backside power via structure in which the frontside-to-backside power via structure directly contacts the fork sheet transistor and is electrically connected to a backside power distribution network.

Backside power delivery refers to a novel technique where power supply lines are routed on the backside of a semiconductor chip or integrated circuit (IC), rather than the traditional frontside. Backside power delivery offers several advantages, including increased logic density and improved power and performance (better signal integrity, reduced noise and improved overall chip performance). Also, placing the power lines on the backside can reduce interference with signal paths and minimize heat buildup near the active device areas.

SUMMARY

A semiconductor device is provided that includes backside power delivery. Specifically, a semiconductor device is provided that includes a fork sheet transistor located between a nanosheet transistor and a frontside-to-backside power via structure in which the frontside-to-backside power via structure contacts the fork sheet transistor and is electrically connected to a backside power distribution network.

In one embodiment of the present application, a semiconductor device is provided that includes a fork sheet transistor having a first side located adjacent to a nanosheet transistor and a second side, opposite the first side, located adjacent to, and in direct contact with, a frontside-to-backside power via structure. The semiconductor device further includes a backside power distribution network electrically connected to the frontside-to-backside power via structure.

In another embodiment of the present application, a semiconductor device is provided that includes a fork sheet transistor having a first side located adjacent to a nanosheet transistor and a second side, opposite the first side, located adjacent to, and in direct contact with, a frontside-to-backside power via structure. The semiconductor device of this embodiment further includes a gate cut structure located laterally adjacent to, and in direct contact with, the frontside-to-backside power via structure, in which the frontside-to-backside power via structure has a first critical dimension and the gate cut structure has a second critical dimension, wherein the second critical dimension is less than the first critical dimension. The semiconductor device of this embodiment even further includes a backside power distribution network electrically connected to the frontside-to-backside power via structure.

DETAILED DESCRIPTION

Figure 1:
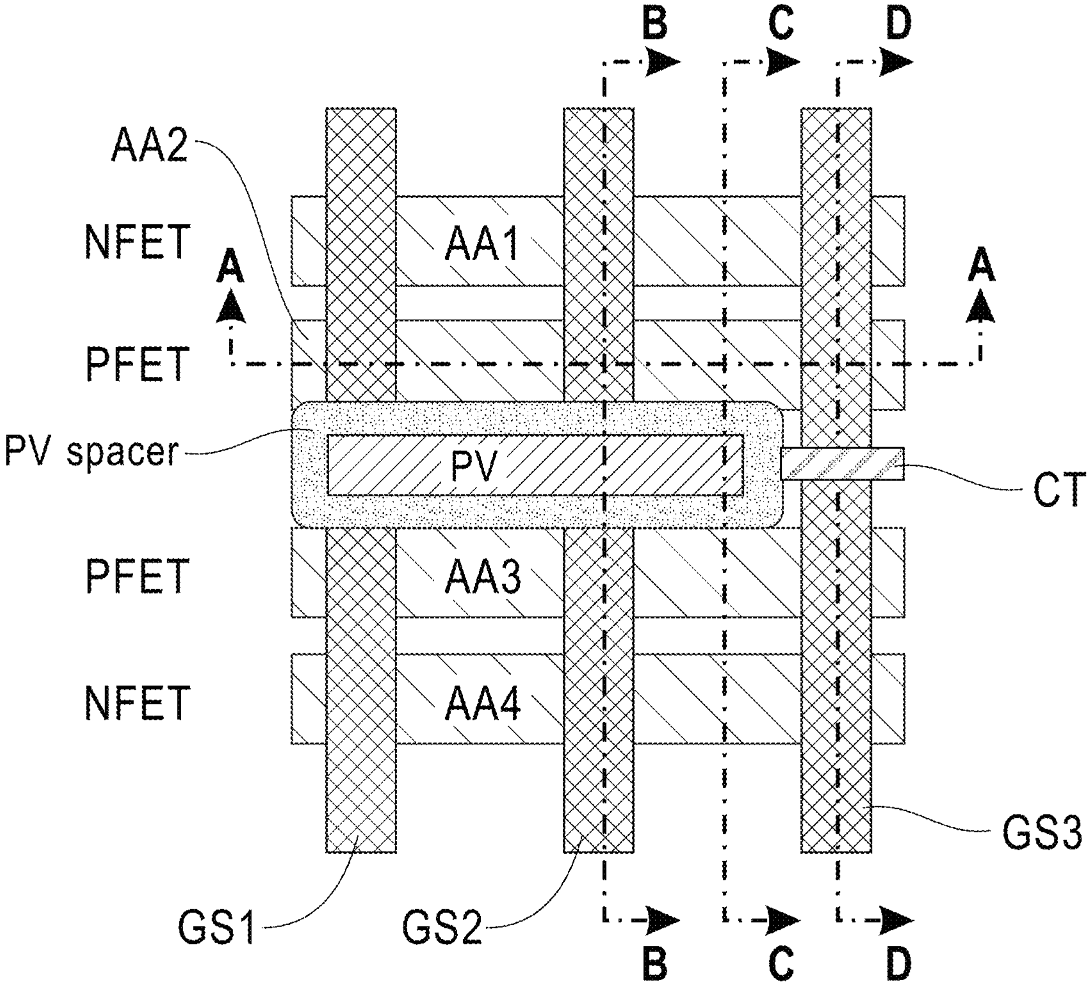
FIG. 1 is a top down view of a device layout that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The terms substantially, substantially similar, about, or any other term denoting functionally equivalent similarities refer to instances in which the difference in length, height, or orientation convey no practical difference between the definite recitation (e.g., the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

A transistor (or field effect transistor (FET)) includes a source region, a drain region, a semiconductor channel region located between the source region and the drain region, and a gate structure located above the semiconductor channel region. Collectively, the source region and the drain region can be referred to as a source/drain region. In the embodiment described in the present application, the transistor includes a nanosheet transistor and a fork sheet transistor that are integrated on a same substrate. A nanosheet transistor is a non-planar transistor that includes a vertical stack of spaced apart semiconductor channel material nanosheets as the semiconductor channel region with a pair of source/drain regions located at each of the ends of the vertical stack of spaced apart semiconductor channel material nanosheets. The gate structure includes a gate dielectric and a gate electrode. The gate structure wraps around each of the spaced apart semiconductor channel material nanosheets and contacts four surfaces of each nanosheet. Nanosheet transistors provide considerable scaling with high drive current capability. Nanosheet transistors provide a larger drive current for a given footprint compared to finFET technology. A fork sheet transistor is similar to the nanosheet transistor except that the gate structure contacts only three surfaces of each nanosheet, the fourth surface (i.e., one of the edges of each nanosheet) is typically in direct physical contact with a dielectric pillar. Fork sheet transistors have reduced PN separation which allows for further area scaling. Fork sheet transistors can also provide variable device width for additional design flexibility, a confined work function metal that reduces variability boundary and improved performance.

In the present application, the semiconductor device includes a frontside and a backside. The frontside includes a side of the device that includes the nanosheet transistor and the fork sheet transistor, frontside contact structures, and a frontside BEOL structure. The backside of the semiconductor device is the side of the device that is opposite the frontside. The backside includes backside contact structures, and a backside interconnect structure. The backside interconnect structure can be a backside power distribution network that is capable of delivering power to the transistors through the backside of the semiconductor device.

Referring first to FIG. 1, there is illustrated a device layout that can be employed in accordance with an embodiment of the present application. The illustrated device layout includes four active device areas, AA1, AA2, AA3 and AA4. AA1 is first active device area in which NFET nanosheet transistors can be formed, AA2 is a second active device area in which PFET fork sheet transistors can be formed, AA3 is a third active device area in which PFET fork sheet transistors can be formed, and AA4 is a fourth active device area in which NFET nanosheet transistors can be formed. In the present application, AA1 and AA2 define a first cell area including a first NFET-PFET pair, and AA3 and AA4 define a second cell area including a second NFET-PFET pair. In the present application, a non-active device area is located between the first cell area and the second cell area in which a power via (PV) is present adjacent to each of the fork sheet transistors that are present in the first cell area and the second cell area. This non-active device area also includes a gate cut structure (CT) that is located adjacent to the power via (PV). The power via (PV) can also include a power via (PV) spacer as shown in FIG. 1 located around the power via (PV). In FIG. 1, three gate structures, GS1, GS2 and GS3 are shown by way of one example. The present application is not limited to using three gate structures. The gate structures run parallel to each other and perpendicular to each of the active device areas.

Although FIG. 1 specifically illustrates NFETs for the nanosheet transistors in AA1 and AA4, and PFETs for the fork sheet transistors in AA2 and AA3, the present application works when PFETs are used for the nanosheet transistors in AA1 and AA4, and NFETs are used for the fork sheet transistors in AA2 and AA3. Also, embodiments are possible in which the nanosheet transistors in AA1 and AA4, and the fork sheet transistors in AA2 and AA3 have a same polarity, i.e., all are NFETs or all are PFETs. Also, although the present application illustrates four active device areas, the present application works with only two active device areas, i.e., AA1 and AA2 or AA3 and AA4. In such an embodiment, one of active device areas includes the nanosheet transistors, the other active device area includes the fork sheet transistors and is adjacent to the non-active device area that includes the PV, PV spacer, and CT.

FIG. 1 also includes four different cuts, namely cut A-A, cut B-B, cut C-C and cut D-D that will be used throughout the remaining drawings of the present application. Cut A-A is a cut that runs in a length wise direction through the middle of AA2. Cut A-A thus shows the second active area in which fork sheet transistors are present. Cut B-B is a cut that runs in a length wise direction through a portion of the second gate structure GS2 and it passes through each of AA1, AA2, the non-active device area, AA3 and AA4. Cut C-C is a cut that runs in a length wise direction between the second gate structure, GS2, and the third gate structure, G3 and it passes through each of AA1, AA2, the non-active device area, AA3 and AA4. Notably, cut C-C will show the source/drain areas of a nanosheet transistor present in AA1, a fork sheet transistor present in AA2, a fork sheet transistor present in AA3, and a nanosheet transistor present in AA4. Cut D-D is a cut that runs in a length wise direction through a portion of the fourth gate structure GS4 and it passes through each of AA1, AA2, the non-active device area, AA3 and AA4.

Referring now to FIGS. 2A-2D, there are illustrated an exemplary structure through cuts A-A, B-B, C-C and D-D, respectively of FIG. 1 that can be used in accordance with an embodiment of the present application. The illustrated exemplary structure includes a dielectric structure passing through a vertical nanosheet stack of alternating sacrificial semiconductor material nanosheets 18 and semiconductor channel material nanosheets 20. In the present application, two dielectric structures and two vertical nanosheet stacks are shown by way of one example. Each dielectric structure includes a dielectric liner 24 located on a sidewall and a bottom wall of a dielectric core 22. The exemplary structure also includes a substrate, shallow trench isolation structures 16, sacrificial gate structure 26, gate spacers 28, inner spacers 30, source/drain regions 32 and a first frontside interlayer dielectric (ILD) layer 34. Each of the elements/components that are illustrated in FIGS. 2A-2D will now be described in more detail.

The substrate includes at least semiconductor device layer 14. In addition to the semiconductor device layer 14, the substrate can also include a semiconductor base layer 10 and/or an etch stop layer 12. Embodiments are contemplated in which the semiconductor base layer 10 and/or the etch stop layer 12 are omitted and the substrate includes only the semiconductor device layer 14. The semiconductor base layer 10 is composed of a first semiconductor material, and the semiconductor device layer 14 is composed of a second semiconductor material. As used throughout the present application, the term "semiconductor material" denotes a material that has semiconducting properties. Examples of semiconductor materials that can be used in the present application include, but are not limited to, silicon (Si), a silicon germanium (SiGe) alloy, a silicon germanium carbide (SiGeC) alloy, germanium (Ge), III/V compound semiconductors or II/VI compound semiconductors. The second semiconductor material that provides the semiconductor device layer 14 can be compositionally the same as, or compositionally different from, the first semiconductor material that provides the semiconductor base layer 10. In some embodiments of the present application, the etch stop layer 12 can be composed of a dielectric material such as, for example, silicon dioxide and/or boron nitride. In other embodiments of the present application, the etch stop layer 12 is composed of a third semiconductor material that is compositionally different from the first semiconductor material that provides the semiconductor base layer 10 and the second semiconductor material that provides the semiconductor device layer 14. In one example, the semiconductor base layer 10 is composed of silicon, the etch stop layer 12 is composed of silicon dioxide, and the semiconductor device layer 14 is composed of silicon. In another example, the semiconductor base layer 10 is composed of silicon, the etch stop layer 12 is composed of silicon germanium, and the semiconductor device layer 14 is composed of silicon.

Shallow trench isolation structures 16 are located in an upper portion of the substrate and are located between the various active device areas. Each shallow trench isolation structure 16 is present in the semiconductor device layer 14 of the substrate. Each shallow trench isolation structure 16 can include a trench dielectric liner and a trench dielectric material. In some embodiments, the trench dielectric liner can be omitted. In one example, the trench dielectric liner is composed of silicon nitride, and the trench dielectric material is composed of silicon dioxide. When present, the trench dielectric liner is present along a sidewall and a bottom wall of the trench dielectric material. In some embodiments, each shallow trench isolation structure 16 can have a topmost surface that is substantially coplanar with a topmost surface of the substrate (e.g., the semiconductor device layer 14). In other embodiments, each shallow trench isolation structure 16 can have a topmost surface that is vertically offset (i.e., higher or lower) than a topmost surface of the substrate (e.g., the semiconductor device layer 14).

Each sacrificial semiconductor material nanosheet 18 that is present in the vertical nanosheet stack is composed of a fourth semiconductor material. The fourth semiconductor material is compositionally different from at least the second semiconductor material that provides the semiconductor device layer 14. Each semiconductor channel material nanosheet 20 that is present in the vertical nanosheet stack is composed of a fifth semiconductor material. The fifth semiconductor material is compositionally different from the fourth semiconductor material. The fifth semiconductor material can be compositionally the same, or compositionally different from the second semiconductor material that provides the semiconductor device layer 14. In some embodiments, the fifth semiconductor material that provides each semiconductor channel material nanosheet 20 provides high channel mobility for NFET devices. In other embodiments, the fifth semiconductor material that provides each semiconductor channel material nanosheet 20 provides high channel mobility for PFET devices. In one example, each semiconductor channel material nanosheet 20 is composed of silicon, and each sacrificial semiconductor material nanosheet 18 is composed of a SiGe alloy.

Figure 2A:
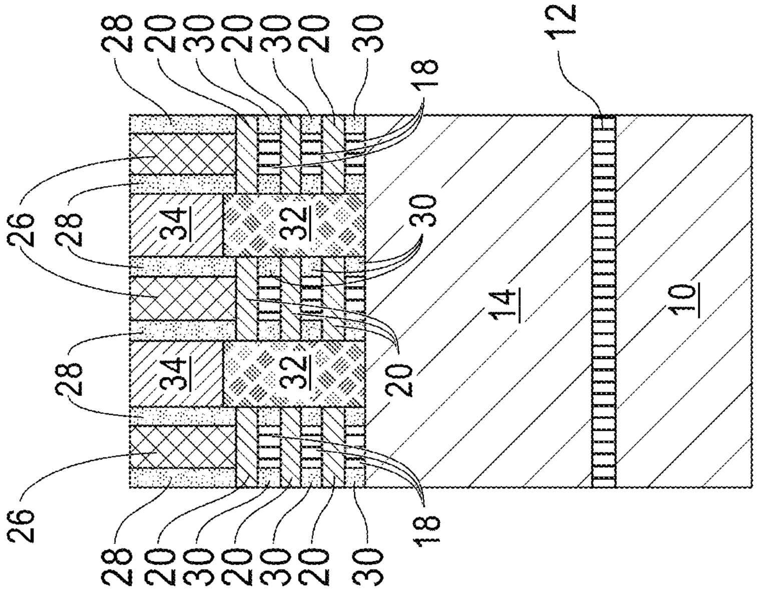
FIGS. 2A-2D are cross sectional views of an exemplary structure through cuts A-A, B-B, C-C and D-D, respectively of FIG. 1 that can be used in accordance with an embodiment of the present application, the exemplary structure including a dielectric structure passing through a vertical nanosheet stack of alternating sacrificial semiconductor material nanosheets and semiconductor channel material nanosheets, the dielectric structure including a dielectric liner located on a sidewall and a bottom wall of a dielectric core.
Figure 2B:
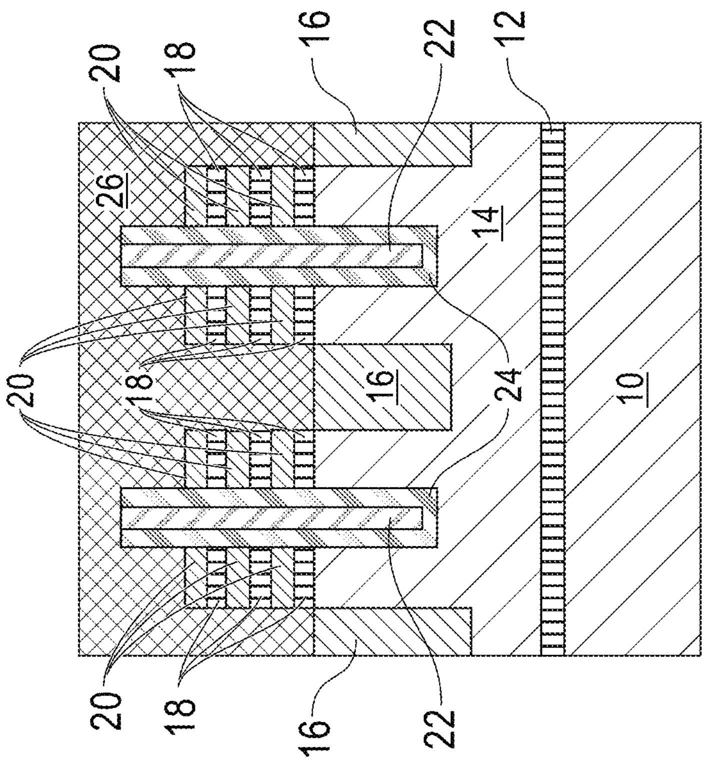
Figure 2C:
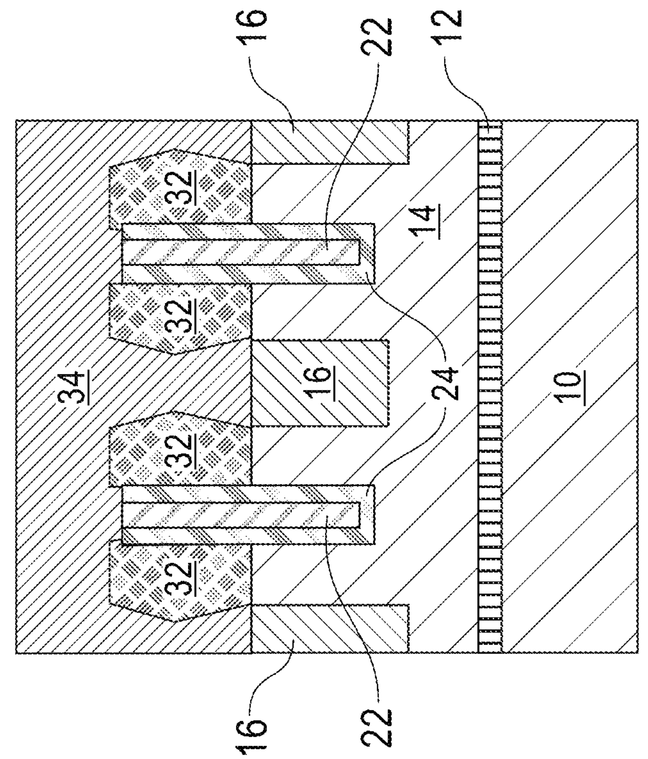
Figure 2D:
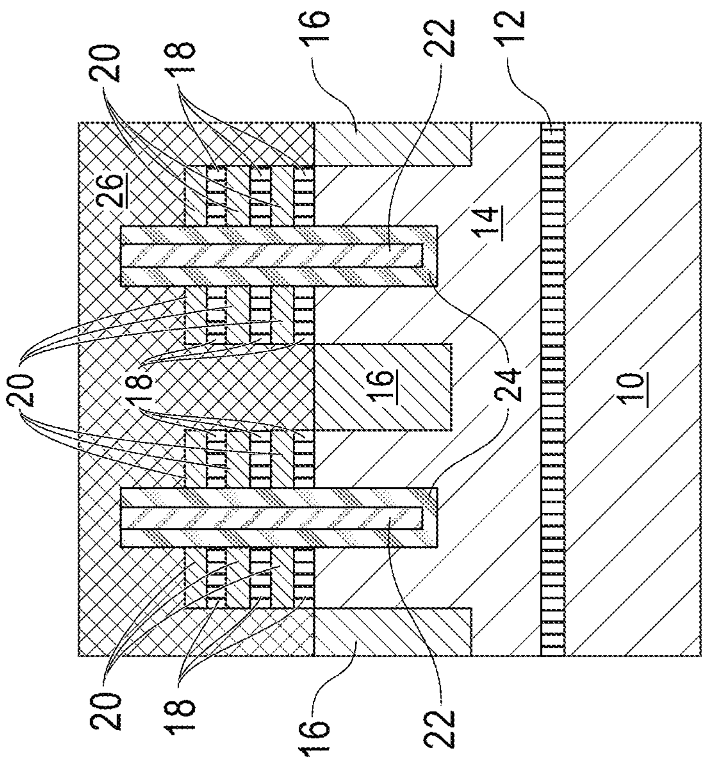

In some embodiments of the present application, and as is illustrated in FIGS. 2A, 2B and 2D, there is an equal number of sacrificial semiconductor material nanosheets 18 and semiconductor channel material nanosheets 20 in a given vertical nanosheet stack. In other embodiments (not shown), each semiconductor channel material nanosheet 20 in a given vertical nanosheet stack is sandwiched between a bottom sacrificial semiconductor material nanosheet and a top sacrificial semiconductor material nanosheet.

In the illustrated embodiment, the bottommost sacrificial semiconductor material nanosheet of each vertical nanosheet stack forms a material interface with the semiconductor device layer 14. In other embodiments, the bottommost sacrificial semiconductor material nanosheet of each vertical nanosheet stack is spaced apart from the semiconductor device layer 14 by a bottom dielectric isolation layer (not shown) and thus forms a material interface with the bottom dielectric isolation layer.

The dielectric liner 24 of the dielectric structure is composed of a first dielectric material, and the dielectric core 22 of the dielectric structure is composed of a second dielectric material which is compositionally different from the first dielectric material. Thus, the dielectric liner 24 has a different etch rate than the dielectric core 22. In one example, the dielectric liner 24 is composed of SiC, while the dielectric core 22 is composed of SiN. As is illustrated in FIGS. 2B-2D, the dielectric structure is present in an upper portion of the substrate, namely the dielectric structure is present in an upper portion of the semiconductor device layer 14. As is illustrated in FIGS. 2B and 2D, the dielectric structure extends above each of the vertical nanosheet stacks. As is illustrated in FIG. 2C, the dielectric structure is located between source/drain regions 32 that are present in the AA1 and AA2 and in AA3 and AA4.

The sacrificial gate structure 26, which straddles each of the vertical nanosheet stacks as shown in FIGS. 2B and 2D, is composed of at least a sacrificial gate material. The sacrificial gate structure 26 can also include an optional sacrificial gate dielectric material (not shown in the drawings) located beneath the sacrificial gate material, and an optional sacrificial gate cap (also not shown in the drawings) located on top of the sacrificial gate material. When present, the sacrificial gate dielectric material is composed of a dielectric material such as, for example, silicon dioxide. The sacrificial gate material can include, but is not limited to, polysilicon, amorphous silicon, amorphous silicon germanium, tungsten (W), titanium (Ti), tantalum (Ta), nickel (Ni), ruthenium (Ru), palladium (Pd) platinum (Pt) or alloys of such metals. When present, the sacrificial gate cap is composed of a hard mask material such as, for example, silicon dioxide, silicon nitride and/or silicon oxynitride.

The gate spacers 28 and inner spacers 30 are composed of a compositionally same, or compositionally different, dielectric spacer material. Illustrative dielectric spacers materials that can be employed in the present application include, but are not limited to, silicon dioxide, SiN, SiBCN, SiOCN or SiOC. At this point of the process, each gate spacer 28 is present along a sidewall of the sacrificial gate structure 26, and each inner spacer 30 is located at a recessed end of each sacrificial semiconductor material nanosheet 18.

Each source/drain region 32 is located on opposing sides of each vertical nanosheet stack. Each source/drain region extends outward from a sidewall of the semiconductor channel material nanosheets 20. Each source/drain region 32 is composed of a sixth semiconductor material and a dopant. As used herein, a "source/drain" region can be a source region or a drain region depending on subsequent wiring and application of voltages during operation of the transistor. The sixth semiconductor material that provides the source/drain regions 32 can be compositionally the same as, or compositionally different from, the fifth semiconductor material that provides each semiconductor channel material nanosheet 20. The dopant that is present in the source/drain regions 32 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, phosphorus and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each of the source/drain regions 32 can have a dopant concentration of from $4\times10^{20}$ atoms/$cm^3$ to $3\times10^{21}$ atoms/$cm^3$. In embodiments in which different conductivity type transistors are to be formed, a first set of source/drain regions can be formed that have a first conductivity type, and a second set of source/drain regions can be formed that have a second conductivity type that differs from the first conductivity type. This can be achieved utilizing block mask technology.

The first frontside ILD layer 34 is composed of ILD material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than 4.0. All dielectric constants mentioned herein are relative to a vacuum unless otherwise noted. As is illustrated in FIG. 2C, the first frontside ILD layer 34 embeds each of the source/drain regions 32.

The exemplary structure shown in FIGS. 2A-2D can be formed utilizing processing techniques well known in the art including those disclosed in U.S. Patent Application Publication No. 2023/0095140 A1. Notably, the exemplary structure shown in FIGS. 2A-2D can be formed by first forming (via a deposition process such as, for example, chemical vapor deposition (CVD), plasma enhanced chemical vapor deposition (PVD) and/or epitaxial growth) a material stack of alternating sacrificial semiconductor material layers and semiconductor channel material layers. The material stack is then cut by lithography and etching to provide an opening through the material stack that extends into the upper portion of the substrate. The dielectric structure including the dielectric liner 24 and the dielectric core 22 is then formed into the opening by deposition of the first dielectric material and the second dielectric material mentioned above, followed by a planarization process such as, for example, chemical mechanical planarization (CMP) and/or grinding. The shallow trench isolation structures 16 are then formed by first providing (by lithography and etching) a trench in an upper portion of the substrate and then filling the trench with at least a trench dielectric material. The filling of the trench can include a deposition process, followed by a recess etch. After forming the shallow trench isolation structures 16, sacrificial gate structure 26 is formed by a deposition process of at least the sacrificial gate material, followed by lithographic patterning. Gate spacers 28 are then formed by deposition of a dielectric spacer material, followed by a spacer etch. Vertical nanosheet stacks are then formed by etching through physically exposed portions of each material stack The etching process utilizes the sacrificial gate structure 26 and the gate spacer 28 as a combined etch mask. A recess etch is then performed to recess an end portion of each of the sacrificial semiconductor material nanosheets 18. The recess etch forms a gap at each of the ends of the recessed sacrificial semiconductor material nanosheets 18 which are then filled with a dielectric spacer material forming inner spacers 30. In embodiments in which a bottom dielectric isolation layer is present, the bottom dielectric isolation layer is formed by first removing a sacrificial semiconductor layer that is formed between the material stack and the substate, and then filling the space between the material stack and the substrate with a spacer dielectric material; this filling process typically occurs simultaneously as the filling of the gaps that provide the inner spacers 30. Next, source/drain regions 32 are formed utilizing CVD, PECVD or an epitaxial growth process. A recess etch can follow to reduce the height of each of the source/drain regions 32. After source/drain region 32 formation, the processing continues by forming the first frontside ILD layer 34 by a deposition process, followed by a planarization process. Unless otherwise stated, planarization can include grinding and/or chemical mechanical planarization (CMP).

Figure 3B:
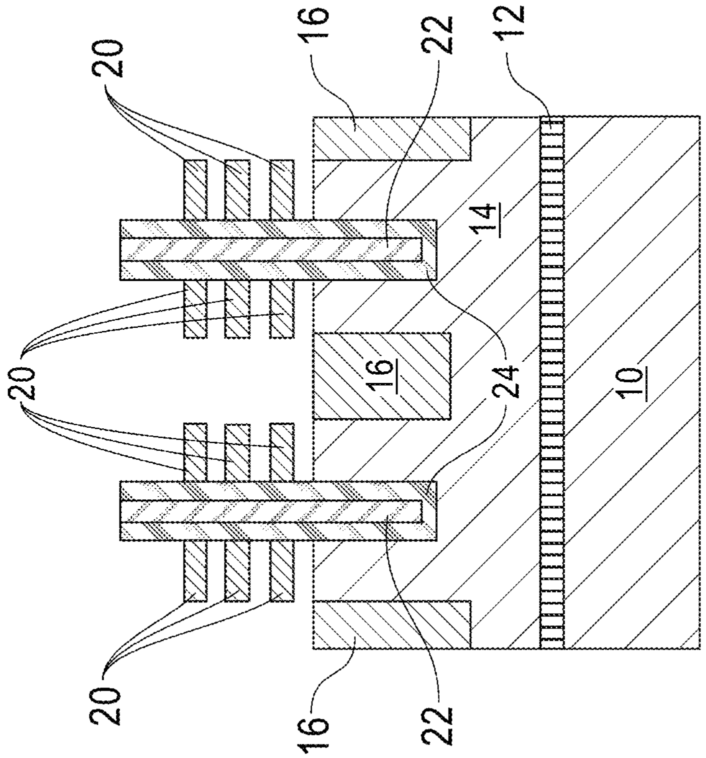
FIGS. 3A-3D are cross sectional views of the exemplary structure of FIGS. 2A-2D, respectively, after revealing the vertical nanosheet stack and removing each sacrificial semiconductor material nanosheet of the revealed nanosheet stack.
Figure 3A:
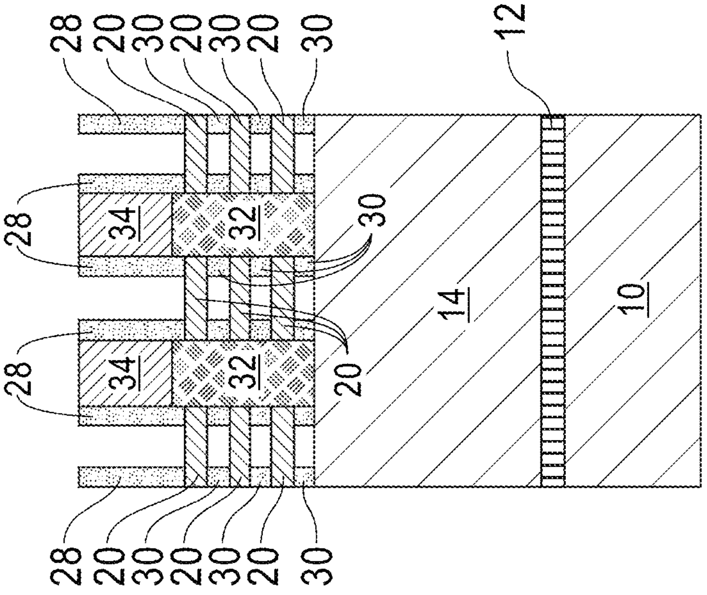
Figure 3C:
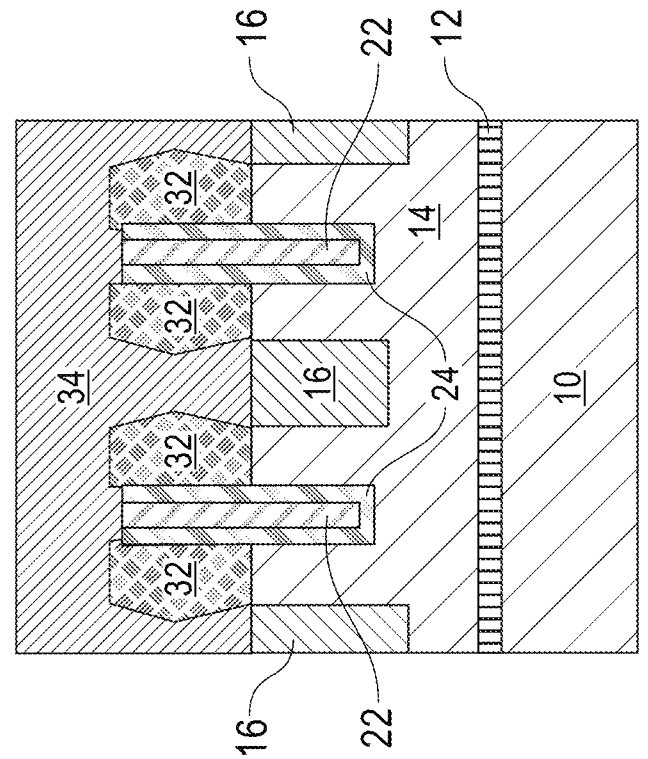
Figure 3D:
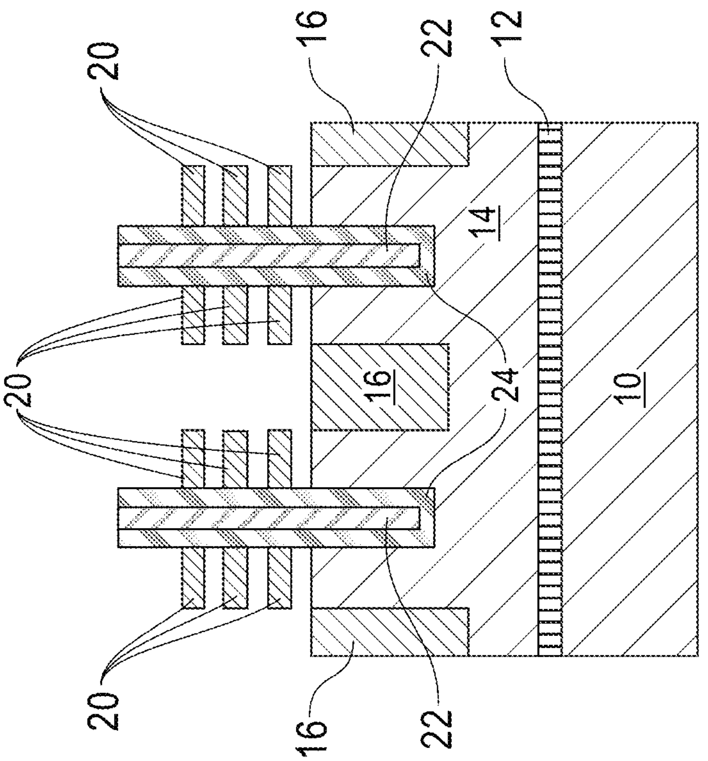

Referring now to FIGS. 3A-3D, there are illustrated the exemplary structure of FIGS. 2A-2D, respectively, after revealing the vertical nanosheet stack and removing each sacrificial semiconductor material nanosheet 18 of the revealed nanosheet stack. The removal of the sacrificial semiconductor material nanosheets 18 suspends each semiconductor channel material nanosheet 20. The suspended semiconductor channel material nanosheet 20 are anchored as shown in FIG. 3A. The revealing of the vertical nanosheet stack includes removing the sacrificial gate structure 26. The sacrificial gate structure 26 can be removed utilizing one or more material removal processes that is (are) selective in removing the sacrificial gate structure 26. After revealing the vertical nanosheet stack, each sacrificial semiconductor material nanosheet 18 is removed utilizing a material removal process such as, for example, an etch, that is selective in removing each sacrificial semiconductor material nanosheet 18.

Figure 4B:
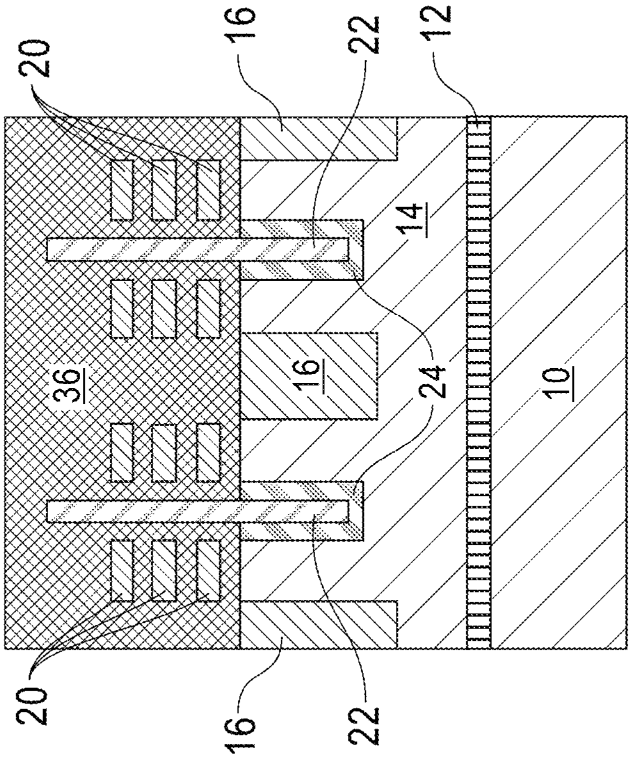
FIGS. 4A-4D are cross sectional views of the exemplary structure of FIGS. 3A-3D, respectively, after selectively removing physically exposed portions of the dielectric liner of the dielectric structure and forming a gate structure.
Figure 4A:
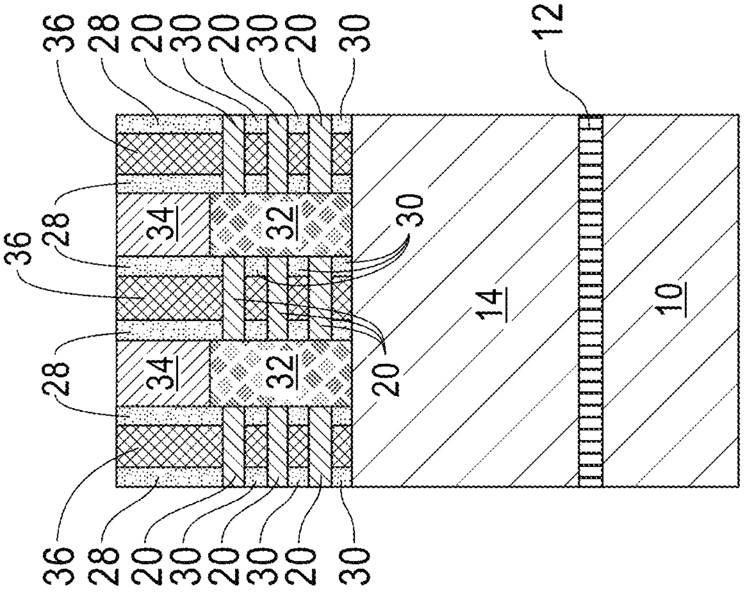
Figure 4D:
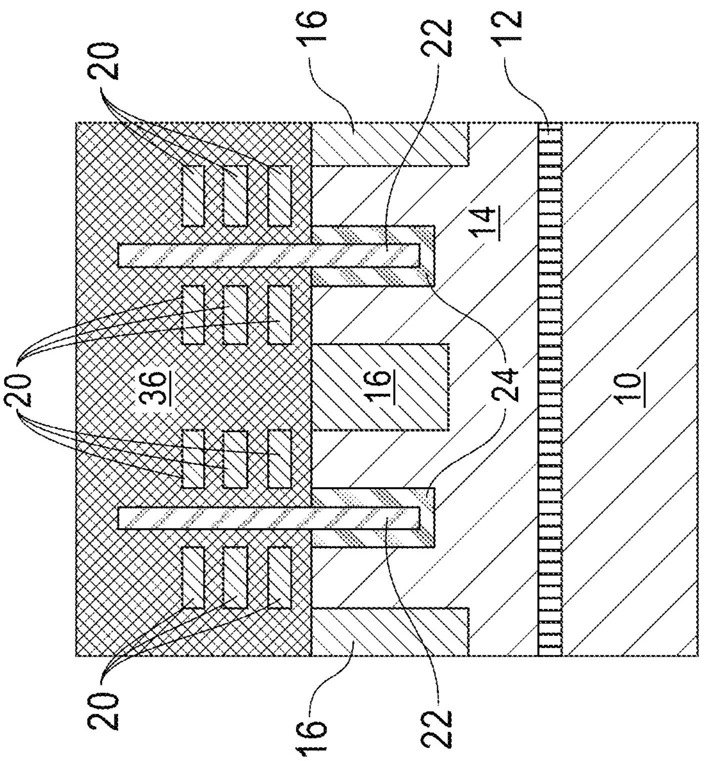
Figure 4C:
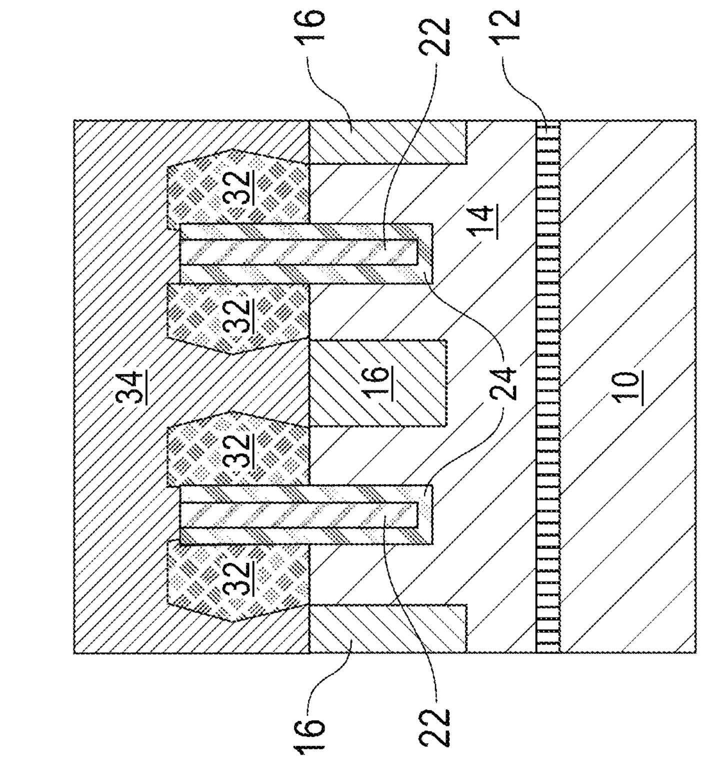
Figure 5B:
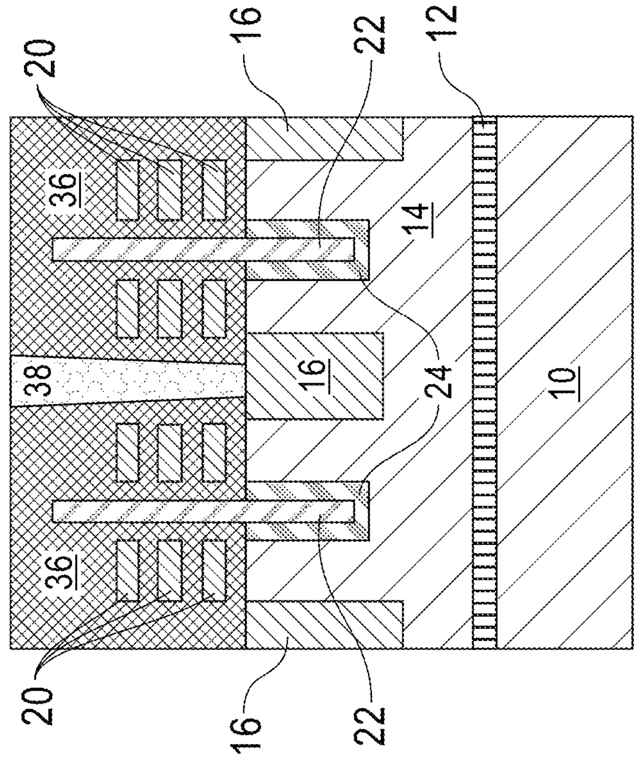
FIGS. 5A-5D are cross sectional views of the exemplary structure of FIGS. 4A-4D, respectively, after forming a gate cut structure in the gate structure.
Figure 5A:
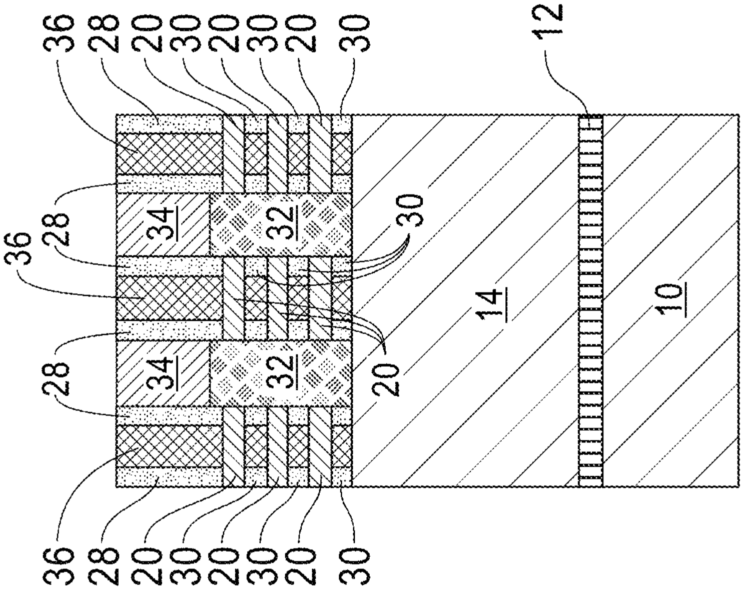
Figure 5D:
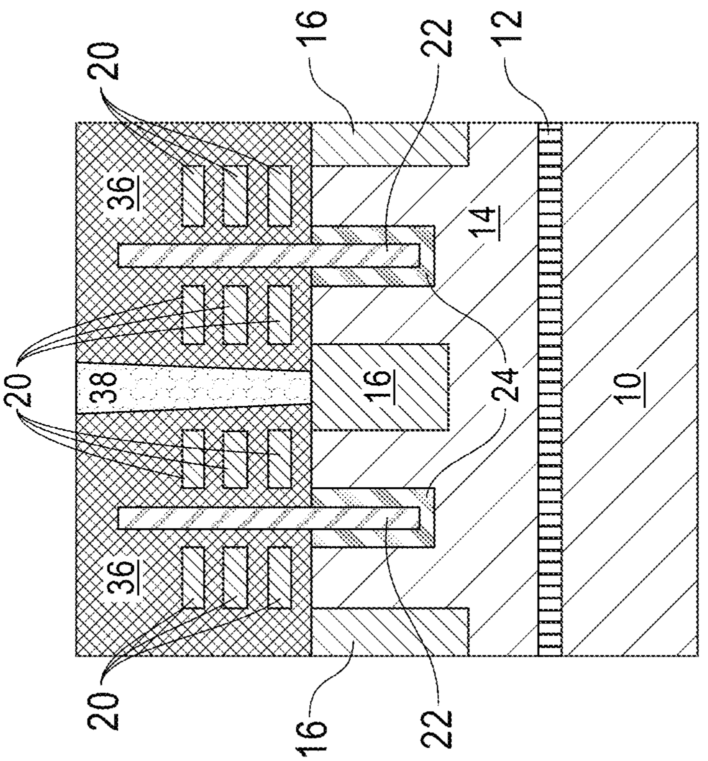
Figure 5C:
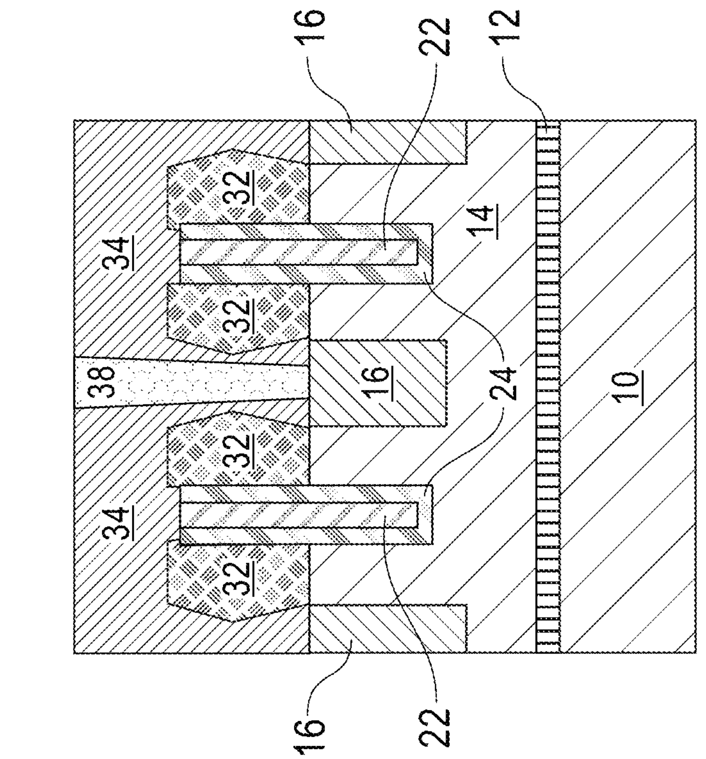
Figure 6B:
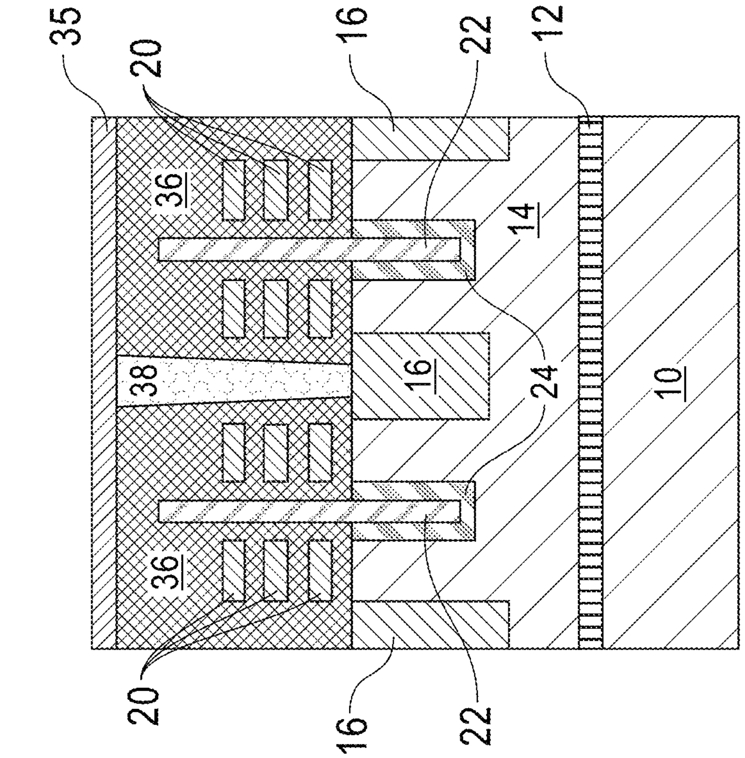
FIGS. 6A-6D are cross sectional views of the exemplary structure of FIGS. 5A-5D, respectively, after forming a second frontside interlayer dielectric (ILD) layer.
Figure 6A:
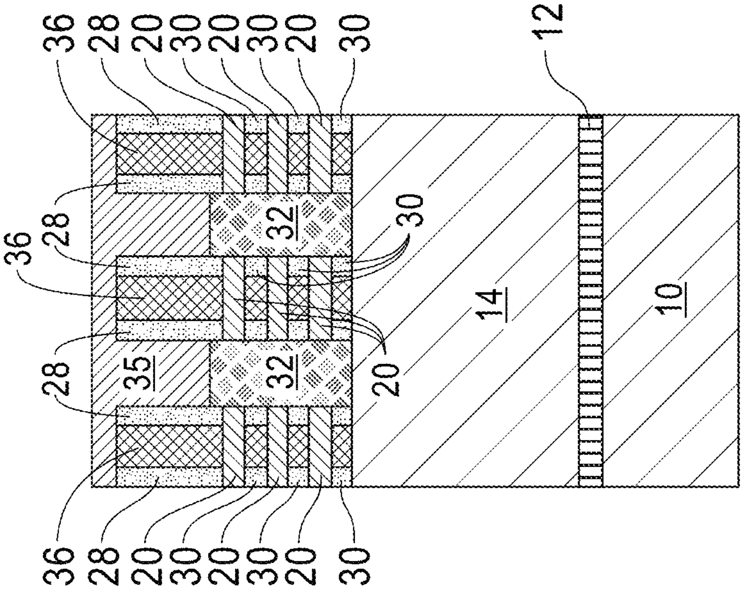
Figure 6D:
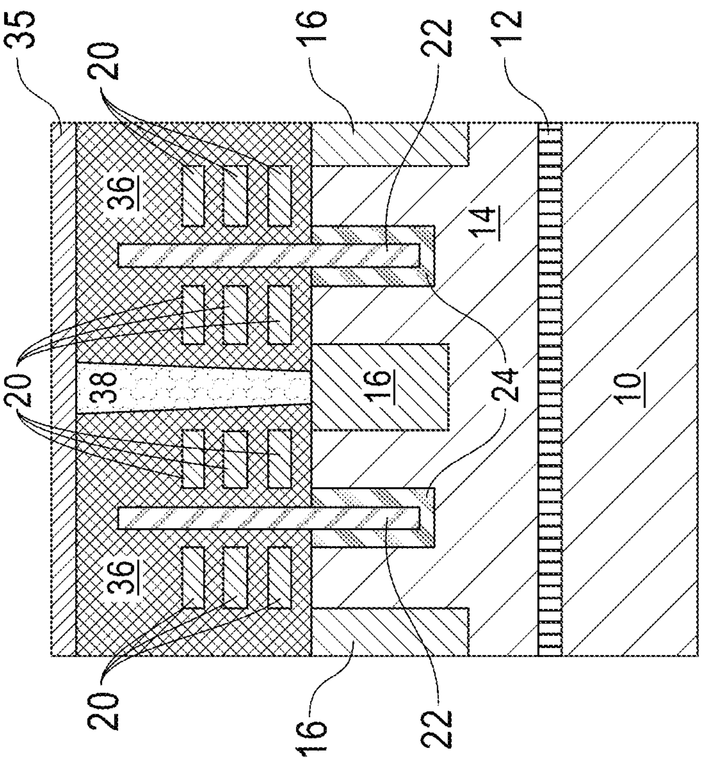
Figure 6C:
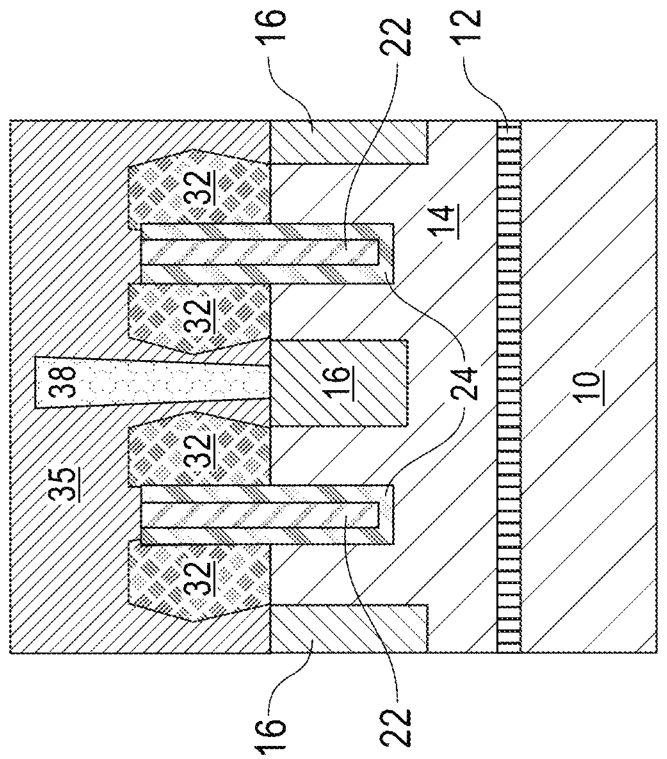

Referring now to FIGS. 4A-4D, there are illustrated the exemplary structure of FIGS. 3A-3D, respectively, after selectively removing physically exposed portions of the dielectric liner 24 of the dielectric structure and forming a gate structure 36. The selective removal of the physically exposed portions of the dielectric liner 24 includes an etching process. It is noted that the etching process does not remove an entirely of the dielectric liner 24. Instead, a portion of the dielectric liner 24 that is located in an upper portion of the substrate (i.e., an upper portion of the semiconductor device layer 14) remains along a sidewall of a lower portion of the dielectric core 22 and beneath the dielectric core 22 as is illustrated in FIGS. 4B-4D. Note that the dielectric liner 24 is not selectively removed between the source/drain regions 32 since the dielectric liner 24 is protected by the first frontside ILD layer 34. In some regions of the structure, the dielectric liner 24 thus has a height that is less than a height of the dielectric core 22.

Gate structure 36 includes a gate dielectric material and a gate electrode, both of which are not separately shown, but intended to be within the region defined by gate structure 36. As is known to those skilled in the art, a gate dielectric material directly contacts a physically exposed surface(s) of the semiconductor channel region, and a gate electrode is formed on the gate dielectric material. The gate dielectric material has a dielectric constant of 4.0 or greater. Illustrative examples of gate dielectric materials include, but are not limited to, silicon dioxide, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite (Pb(Zn,Nb) O). The gate dielectric material can further include dopants such as lanthanum (La), aluminum (Al) and/or magnesium (Mg). The gate electrode can include a work function metal (WFM) and optionally a conductive metal. The WFM can be used to set a threshold voltage of the transistor to a desired value. In some embodiments, the WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations thereof. In other embodiments, the WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof. The optional conductive metal can include, but is not limited to aluminum (Al), tungsten (W), or cobalt (Co). The gate structure 36 can be formed by a deposition process, followed by a planarization process.

At this point of the present application, the gate structure 36 entirely surrounds each semiconductor channel material nanosheet 20 as is shown in FIGS. 4B and 4D. That is, the gate structure 36 wraps around and contacts four sides of each semiconductor channel material nanosheet 20. At this point of the present application, only nanosheet transistors are formed in all of the active device areas. It is noted that the gate structure 36 extends above the dielectric core 22.

Referring now to FIGS. 5A-5D, there are illustrated the exemplary structure of FIGS. 4A-4D, respectively, after forming a gate cut (CT) structure 38 in the gate structure 36; the gate cut structure 38 is also formed in the frontside ILD layer 34. In the present application, the gate cut structure 38 separates the gate structure 36 in AA2 and AA3 from each other. The gate cut structure 38 lands on a surface of one of the shallow trench isolation structures 16 and it has a topmost surface that is substantially coplanar with at least the topmost surface of the gate structure 36. The gate cut structure 38 is composed of a gate cut dielectric material such as, for example, a silicon carbon based dielectric material (e.g., SiC), or a dielectric material including atoms Si, C and O. Other dielectric materials can be used as the gate cut dielectric material that provides the gate cut structure 38. The gate cut structure 38 can be formed by first forming a gate cut trench into the gate structure 36 and first frontside ILD layer 34, and then filling (by deposition and planarization) the gate cut trench with a gate cut dielectric material.

Referring now to FIGS. 6A-6D, there are illustrated the exemplary structure of FIGS. 5A-5D, respectively, after forming a second frontside ILD layer (not specifically labeled in FIGS. 6A-6D). Collectively, the first frontside ILD layer 34 and the second frontside ILD layer provide a multi-layered ILD structure 35. The second dielectric layer can be composed of a compositionally same, or compositionally different, ILD material than the frontside ILD layer 34. When the first frontside ILD layer 34 and the second frontside ILD layer are composed of a compositionally same ILD material, no material interface is present between the two ILD layers (such an embodiment in illustrated in FIGS. 6A-6D). When the first frontside ILD layer 34 and the second frontside ILD layer are composed of compositionally different ILD materials, a material interface (not shown) is present between the two ILD layers. The second frontside ILD layer can be formed by a deposition process, followed by a planarization process.

Referring now to FIGS. 7A-7D, there are illustrated the exemplary structure of FIGS. 6A-6D, respectively, after power via patterning in which a power via opening 42 is formed. The power via patterning includes forming a power via patterned mask 40 having an opening therein. The location of the opening corresponds to the region of the semiconductor structure in which a power via opening 42 is to be formed. Notably, this region is the non-active device area that is positioned between AA2 and AA3. The power via patterned mask 40 is composed of a masking material or combination of masking materials. In one example, the masking material is an organic planarization material. The power via patterned mask 40 can be formed by deposition of a blanket layer of masking material(s), followed by lithography and etching. The deposition of the blanket layer of masking material(s) can include CVD, PECVD, or spin-on coating.

Figure 7B:
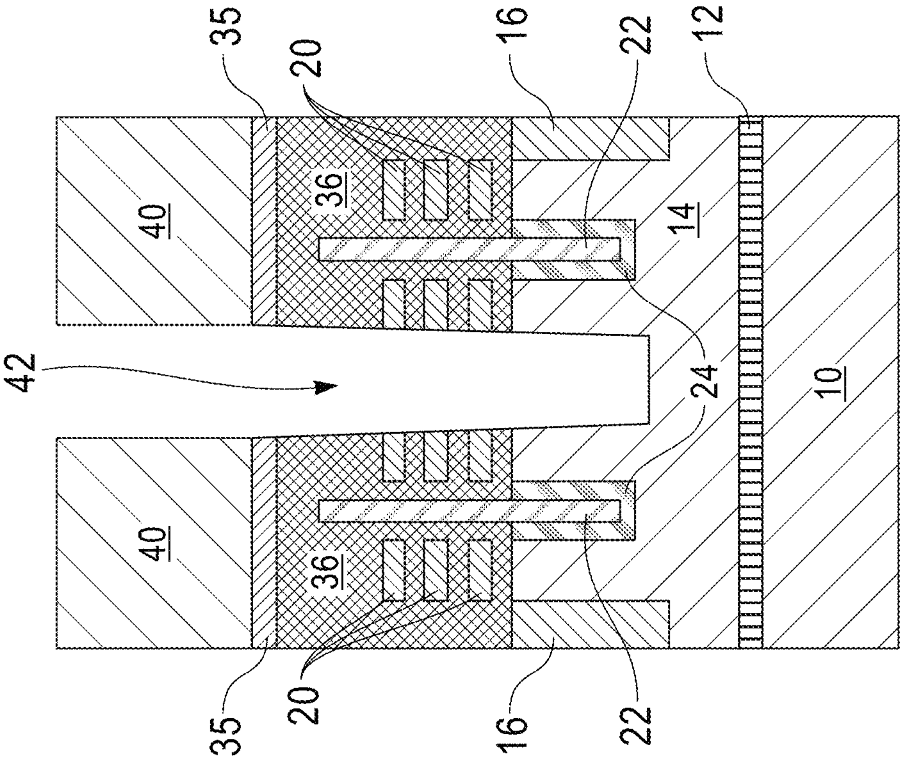
FIGS. 7A-7D are cross sectional views of the exemplary structure of FIGS. 6A-6D, respectively, after frontside-backside power via patterning in which a power via opening is formed.
Figure 7A:
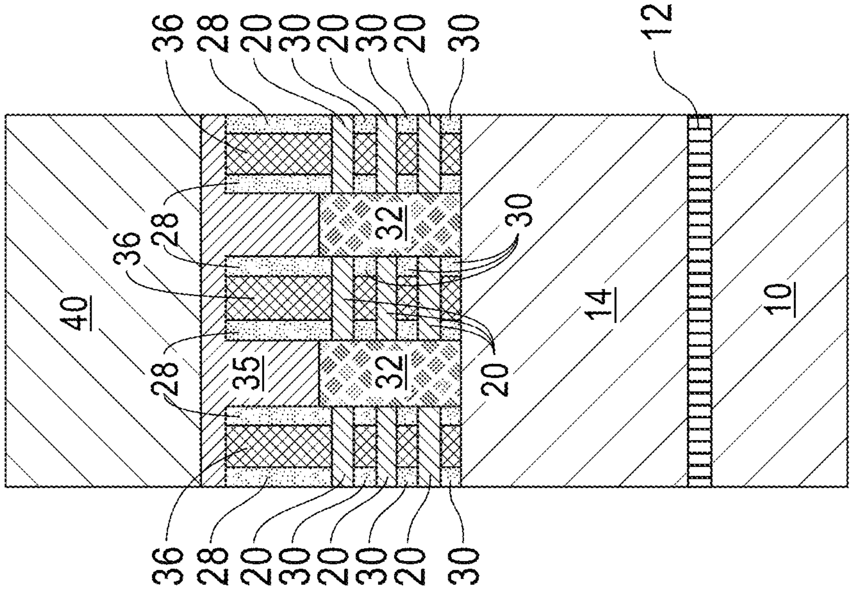
Figure 7D:
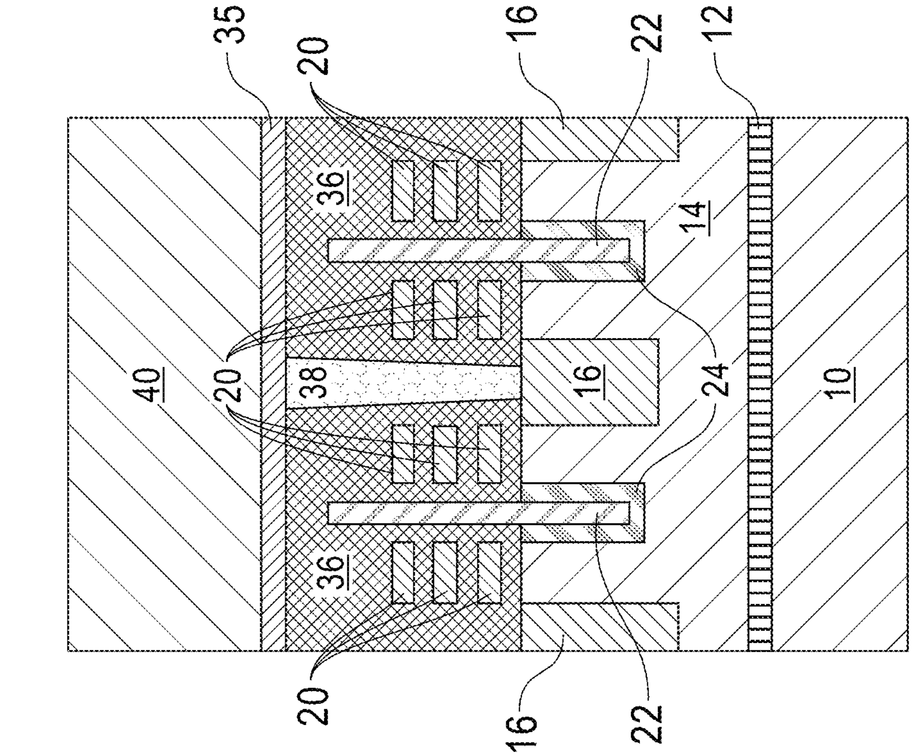
Figure 7C:
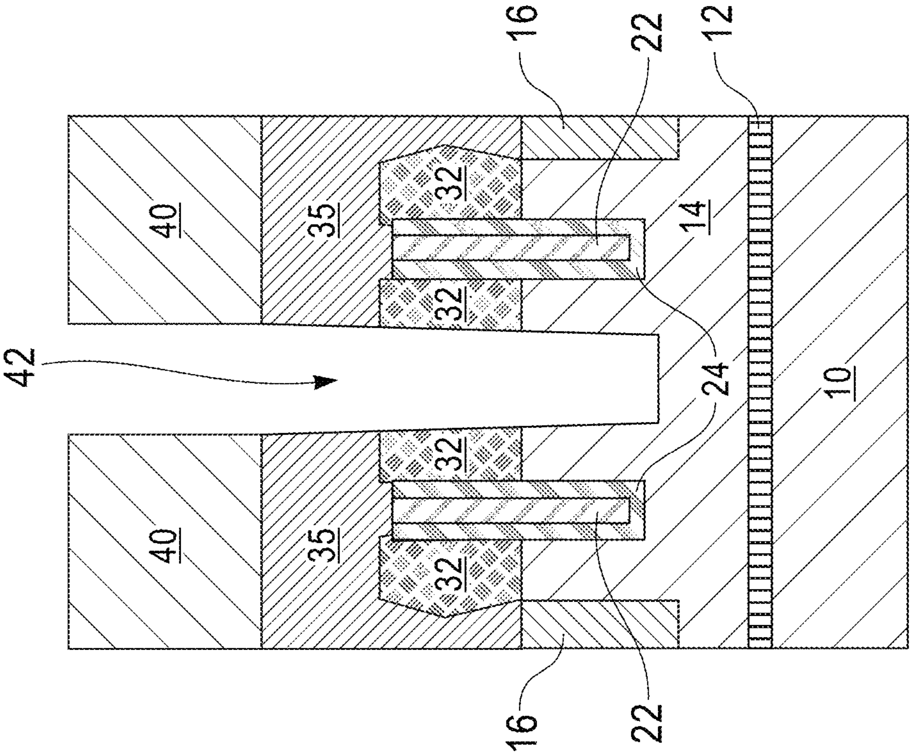
Figure 8A:
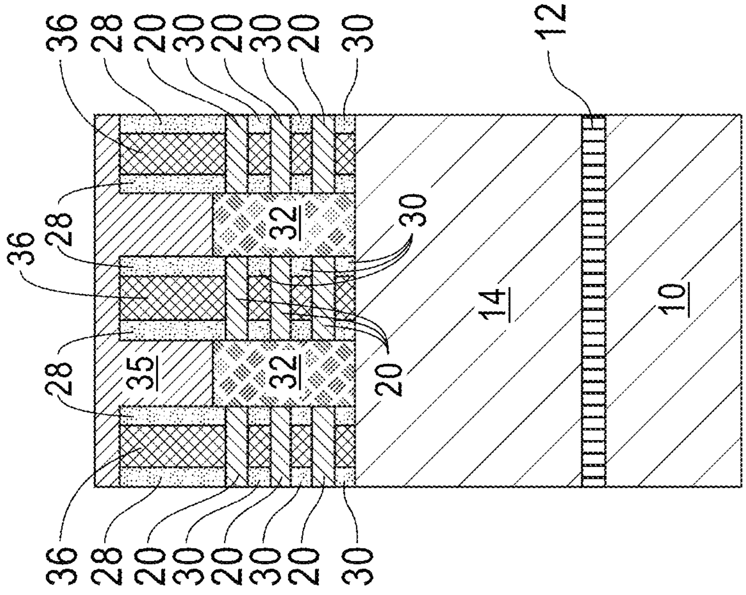
FIGS. 8A-8D are cross sectional views of the exemplary structure of FIGS. 7A-7D, respectively, after forming a power via liner and a power via in the power via opening.
Figure 8B:
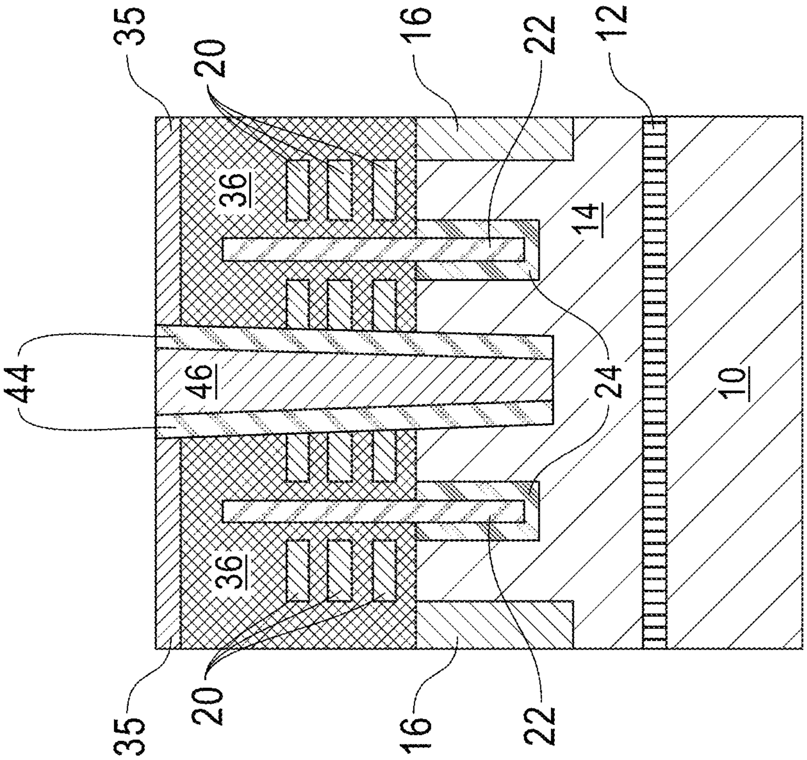
Figure 8D:
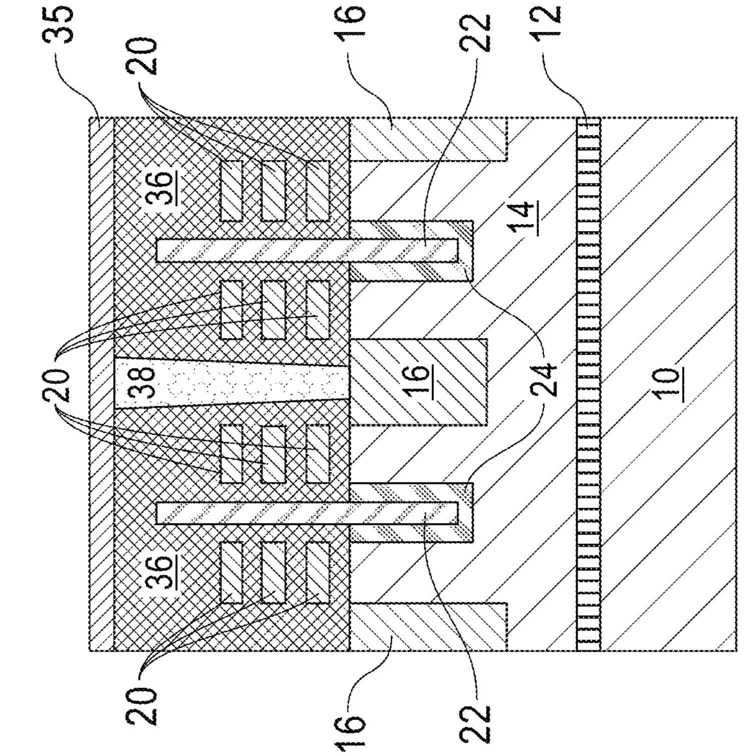
Figure 8C:
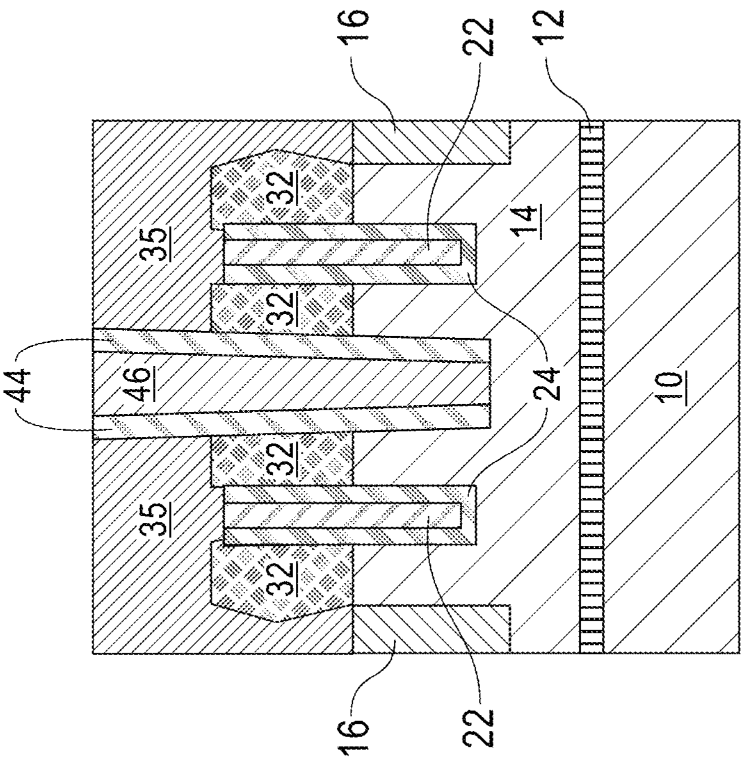
Figure 9B:
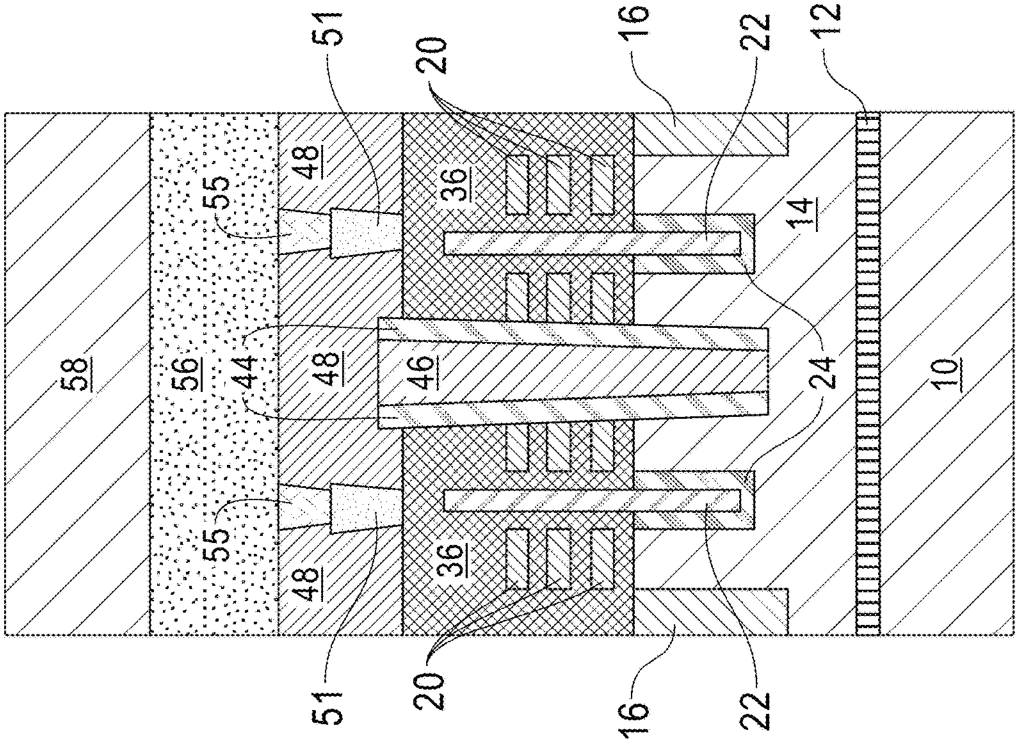
FIGS. 9A-9D are cross sectional views of the exemplary structure of FIGS. 8A-8D, respectively, after forming a middle-of-the-line (MOL) level, a frontside back-end-of-the-line (BEOL) structure and a carrier wafer.
Figure 9A:
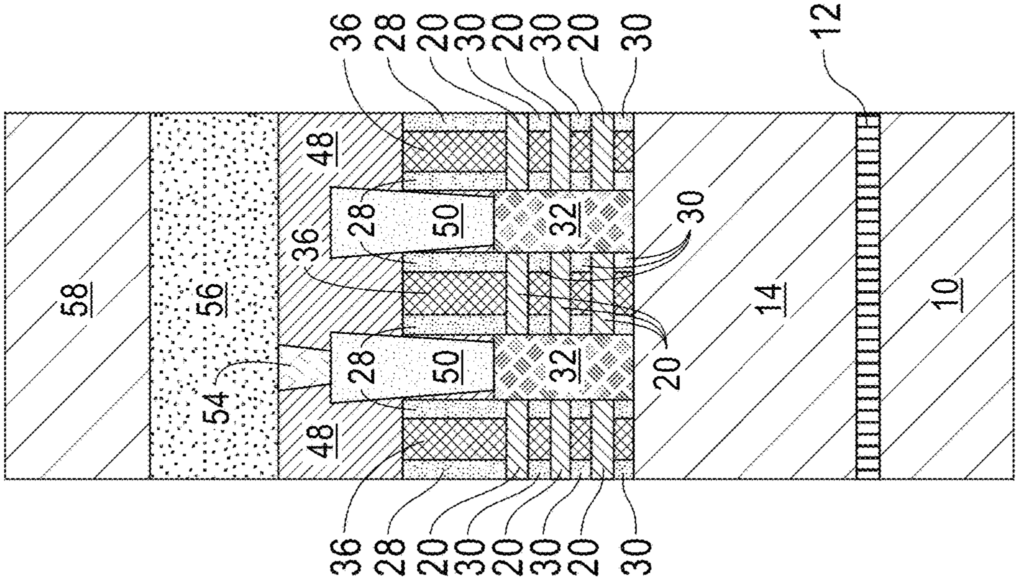
Figure 9D:
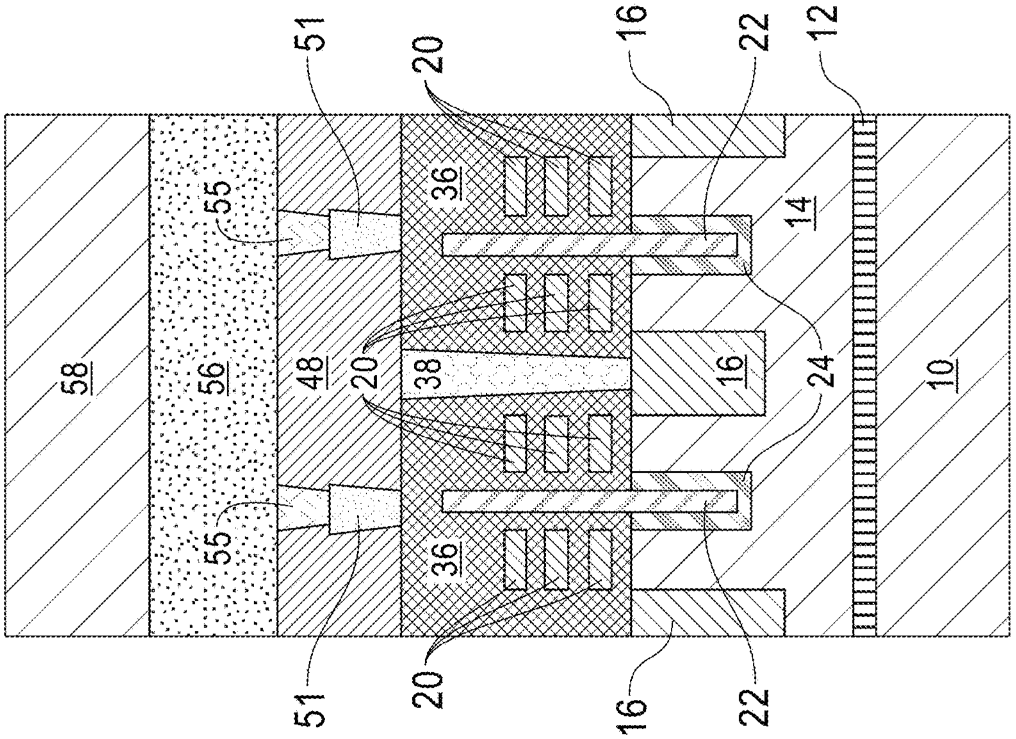
Figure 9C:
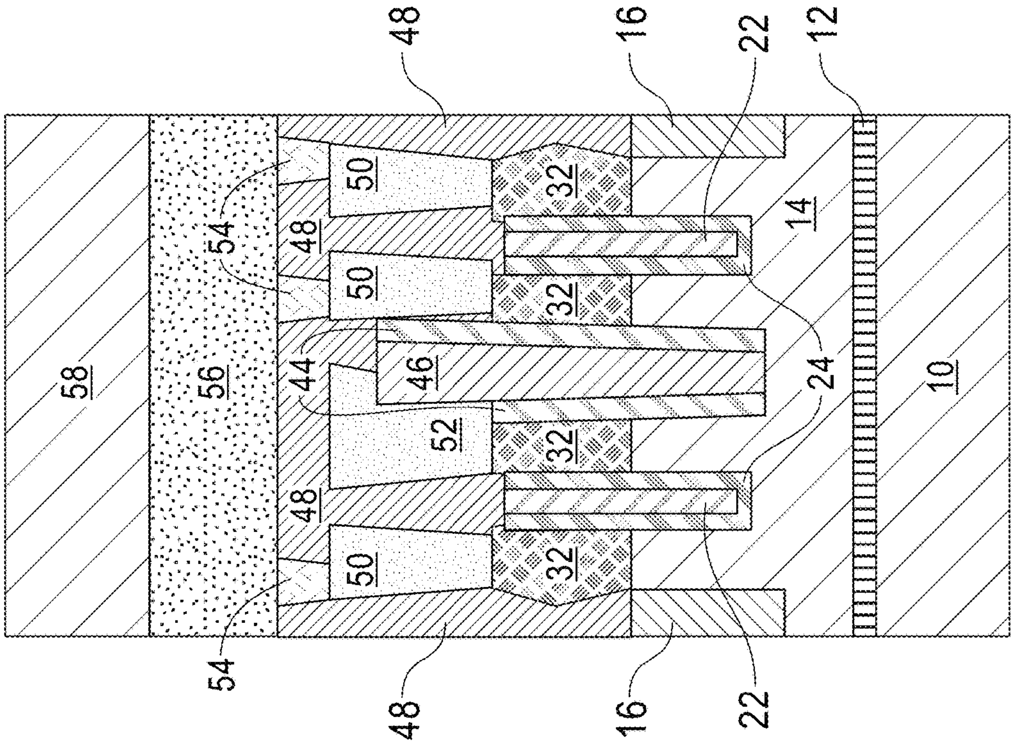

After forming the power via patterned mask 40, an etch such as, for example, a reactive ion etch (RIE) or a plasma etch, is used to form the power via opening 42. As is illustrated in FIGS. 7B and 7C, the power via opening 42 begins on the frontside of the device and ends in an upper portion of the substrate, Namely, the power via opening 42 ends in the semiconductor device layer 14 such that a sub-surface (i.e., a surface of a material/structure that is located between a topmost surface and a bottommost surface of the same material/structure) is physically exposed. The etch removes physically exposed portions of the multi-layered ILD structure 35, the gate cut structure 38, the gate structure 36 and the semiconductor device layer 14. As illustrated, in FIG. 7B, the power via opening 42 physically exposes a sidewall of the semiconductor channel material nanosheets 20 that are located adjacent to the non-active device area. The gate structure 36 in AA1 and AA2 and in AA3 and AA4 are still linked together over the dielectric core 22 of the dielectric structure as is also illustrated in FIG. 7B. As illustrated in FIG. 7C, the etch can also remove a sidewall portion of the source/drain regions 32 in the source/drain region that is between the AA2 and AA3.

After forming the power via opening 42, the power via patterned mask 40 is removed from the exemplary structure utilizing a material removal process including, for example, ashing, which is selective in removing the power via patterned mask 40.

Referring now to FIGS. 8A-8D, there are illustrated the exemplary structure of FIGS. 7A-7D, respectively, after forming a power via dielectric liner 44 and a power via 46 in the power via opening 42. In the present application, the power via dielectric liner 44 is formed prior to the power via 46. Collectively, the combination of the power via dielectric liner 44 and power via 46 provides a via structure of the present application which is a precursor to the frontside-to-backside power via structure of the present application. In the present application, the via structure (and later the frontside-to-backside power via structure) is designed to be in direct physical contact with gate cut structure 38 (this is best shown in FIG. 1 of the present application). Although a single power via dielectric liner 44 is described and illustrated, the present application contemplates embodiments in which multiple power via dielectric liners are present.

The power via dielectric liner 44 is composed of a power via dielectric material such as, for example, silicon dioxide, silicon nitride, silicon oxynitride, or SiC. The power via dielectric liner 44 is formed along the sidewall and bottom wall of the power via 46. The power via dielectric liner 44 can be a conformal liner. The term "conformal" denotes that a layer/liner has a same thickness as measured from a horizontal surface of another layer as a thickness as measured from a vertical surface of the another layer. The power via 46 is composed of is composed of an electrically conductive power rail material. The electrically conductive power rail material includes, but is not limited to, W, Co, Ru, Al, Cu, Pt, Rh, or Pd. The power via dielectric liner 44 and power via 46 can be formed by deposition of the respective materials, followed by a planarization process.

The via structure defined by the combination of the power via dielectric liner 44 and power via 46 is in direct contact with the previously exposed sidewall of the semiconductor channel material nanosheets that is located at the edge of the non-active device area. Thus, fork sheet transistor are now formed in AA2 and AA3 and the via structure is located between AA2 and AA3. It is noted that gate structure 36 is shared between the transistors found in AA1 and AA2, and the transistors found in AA3 and AA4. It is noted that the via structure (and the subsequent frontside-to-backside power via structure) has a topmost surface that extends above a topmost surface of the gate structure 36.

Referring now to FIGS. 9A-9D, there are illustrated the exemplary structure of FIGS. 8A-8D, respectively, after forming a MOL level, a frontside BEOL structure 56 and a carrier wafer 58. The MOL level includes at least one additional ILD layer (not separately) formed on the multi-layered ILD structure 35. The at least one additional ILD layer includes an ILD material as mentioned above. The at least one additional ILD layer can be formed by deposition, followed by a planarization process. Collectively, the multi-layered ILD structure 35 and the at least one additional ILD layer provide a MOL multi-layered structure 48. Within the MOL multi-layered structure 48, there are formed various frontside contact structures including, for example, frontside source/drain contact structures 50, frontside gate contact structures 51, and a frontside source/drain-power via contact structure 52. Also formed in the MOL multi-layered structure 48 are metal via structures 54, 55.

Each of the frontside contact structures including the frontside source/drain contact structures 50, the frontside gate contact structures 51, and the frontside source/drain-power via contact structure 52 is composed of at least a contact conductor material. The contact conductor material can include, for example, a silicide liner, such as Ni, Pt, NiPt, an adhesion metal liner, such as TiN, and conductive metals such as W, Cu, Al, Co, Ru, Mo, Os, Ir, Rh, or an alloy thereof. Each of frontside contact structures can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as Ti, Ni, NiPt, etc., and a diffusion barrier material, as defined above. Each of the frontside contact structures can be formed by a metallization process which includes forming (by lithography and etching) frontside contact openings in at least some of the ILD layers that provide the MOL multi-layered structure 48, and then filling each frontside contact opening with at least a contact conductor material as defined above. The filling of each frontside contact opening can include a deposition process (such as, for example, CVD, PECVD, atomic layer deposition (ALD) or sputtering), followed by a planarization process.

The metal via structures 54, 55 are composed of an electrically conductive metal or an electrically conductive metal alloy. Illustrative examples of electrically conductive metals that can be used include, but are not limited to, Cu, Al, Co, Ru, Mo, Os, Ir, or Rh. An illustrative electrically conductive alloy that can be used includes, but is not limited to, a Cu—Al alloy. Each of the metal via structures 54, 55 can be formed by a metallization process as defined herein.

In the present application, each frontside source/drain contact structure 50 contacts a source/drain region 32 and is connected to the frontside BEOL structure 56 by one of the metal via structures 54. In the present application, each frontside gate contact structure 51 contacts a gate electrode portion of a gate structure 36 and is connected to the frontside BEOL structure 56 by one of the metal via structure 55. In the present application, the frontside source/drain-power via contact structure 52 contacts a source/drain region 32 of one of the fork sheet transistors that is present in AA2. In some embodiments and during the formation of the frontside source/drain-power via contact structure 52, a portion of the power via dielectric liner 44 that is present along an upper sidewall of the power via 46 is removed. In such an embodiment (see, for example, FIG. 9C), the frontside source/drain-power via contact structure 52 contacts a sidewall of the power via 46 and a topmost surface of the power via 46. In such an embodiment, the power via dielectric liner 44 located on one side of the power via 46 has first height, and the power via dielectric liner 44 located on the other side of the power via 46 has a second height in which the first height is less than the second height. In other embodiments, the height of the power via dielectric liner 44 on both sides of the power via 46 are the same and in such embodiments, the frontside source/drain-power via contact structure 52 contacts only the topmost surface of the power via 46.

The frontside BEOL structure 56 is composed of an interconnect dielectric region having frontside metal wiring embedded therein. The interconnect dielectric region includes one or more interconnect dielectric material layers. The interconnect dielectric material layers can be composed of at least one of the ILD materials mentioned above. The frontside metal wiring can be in the form of metal lines, metal vias, a metal via/metal line combination or any combinations thereof. The frontside metal wiring is composed of an electrically conductive metal or an electrically conductive metal alloy as mentioned above. The frontside BEOL structure 56 can be formed utilizing any well-known BEOL process including a damascene process or a subtractive metal etch process.

After forming the frontside BEOL structure 56, carrier wafer 58 is formed on the frontside BEOL structure 56. Carrier wafer 58 can include a semiconductor material as defined above. Carrier wafer 58 is bonded to the frontside BEOL structure 56 utilizing any bonding process that is well known to those skilled in the art. This concludes the frontside processing of the exemplary structure, backside processing will now be performed.

Referring now to FIGS. 10A-10D, there are illustrated the exemplary structure of FIGS. 9A-9D, respectively, after backside processing in which at least a backside power rail structure and backside power distribution network 66 are formed. The backside power rail structure includes a backside power rail 64 and a backside power rail dielectric liner 62.

Backside processing begins by flipping the exemplary structure 180° to physically expose a backside of the substate. For clarity, the flipping step is not shown in the drawings. Flipping can be performed by hand or by utilizing a mechanical means such as, for example, a robot arm. After flipping, and in the illustrated embodiment, the semiconductor base layer 10 is physically exposed and the physically exposed semiconductor base layer 10 is removed utilizing a material removal process that is selective in removing the semiconductor material that provides the semiconductor base layer 10. The removal of the semiconductor base layer 10 reveals the etch stop layer 12. The etch stop layer 12 can then be removed utilizing a material removal process that is selective in removing the material that provides the etch stop layer 12. The removal of the etch stop layer 12 physically exposes the semiconductor device layer 14. It is noted that the removal of the semiconductor base layer 10 and/or etch stop layer 12 can be omitted when such layers are not present. In some embodiments (not shown), an entirety, or a portion, of the semiconductor device layer 14 can be removed utilizing a material removal process that is selective in removing the semiconductor device layer 14. Next, first backside ILD layer 60 is formed) and the first backside ILD layer 60 can be formed in the area previously occupied by the semiconductor device layer 14). The first backside ILD layer 60 is composed of an ILD material as mentioned above. The first backside ILD layer 60 can be formed by deposition (e.g., CVD, PECVD or spin-on coating), followed by a planarization process. In some embodiments, not shown, a portion of, or an entirety of, the semiconductor device layer 14 is removed prior to forming the first backside ILD layer 60.

Figure 10B:
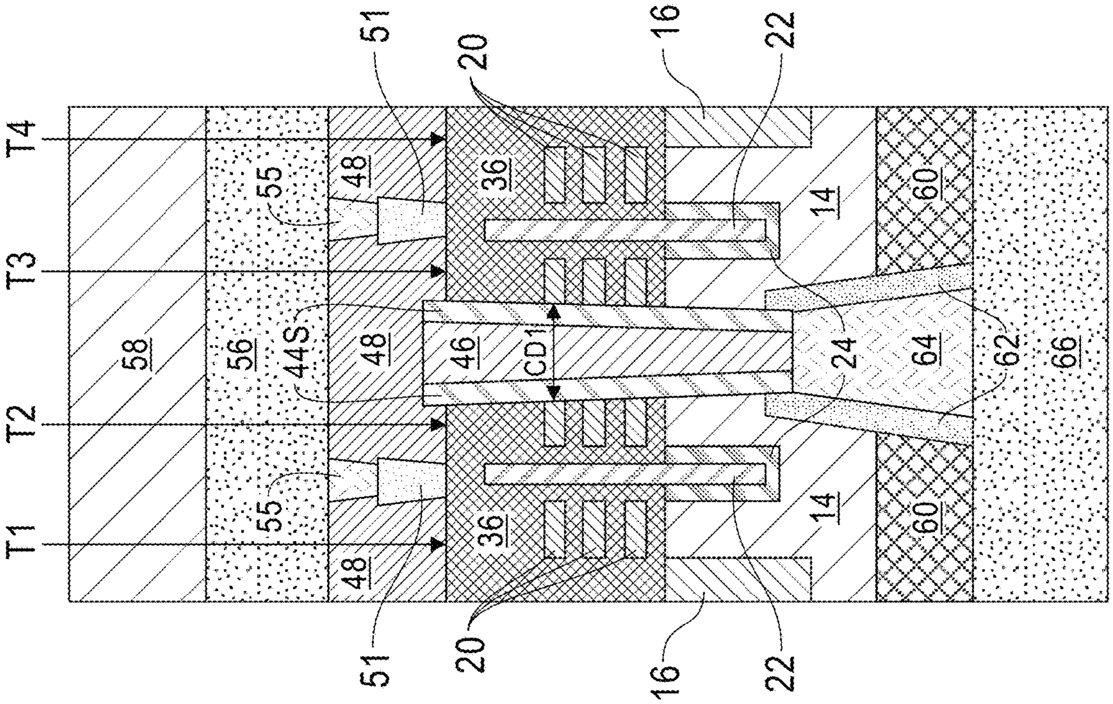
FIGS. 10A-10D are cross sectional views of the exemplary structure of FIGS. 9A-9D, respectively, after backside processing in which at least a backside power rail structure and backside power distribution network are formed.
Figure 10A:
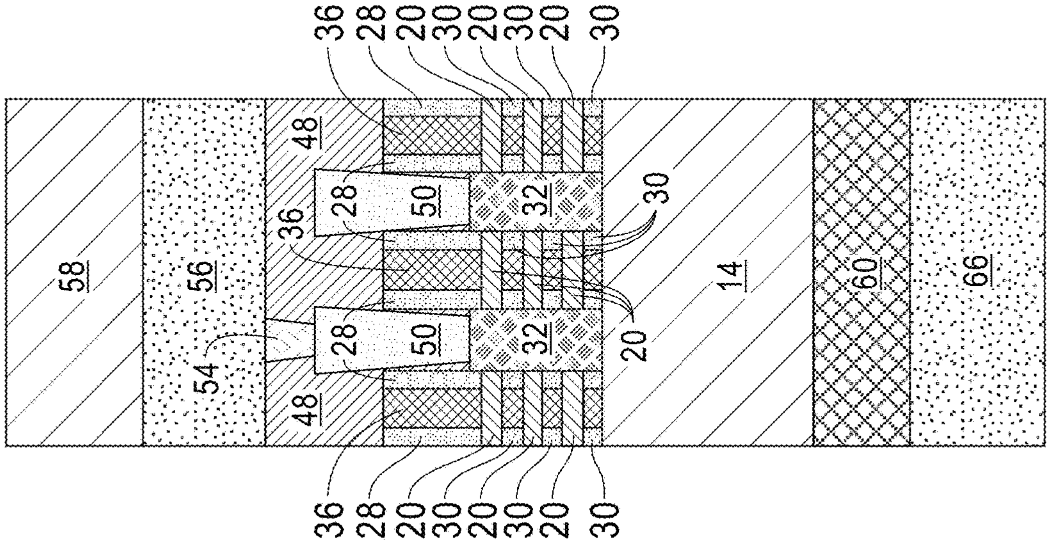
Figure 10D:
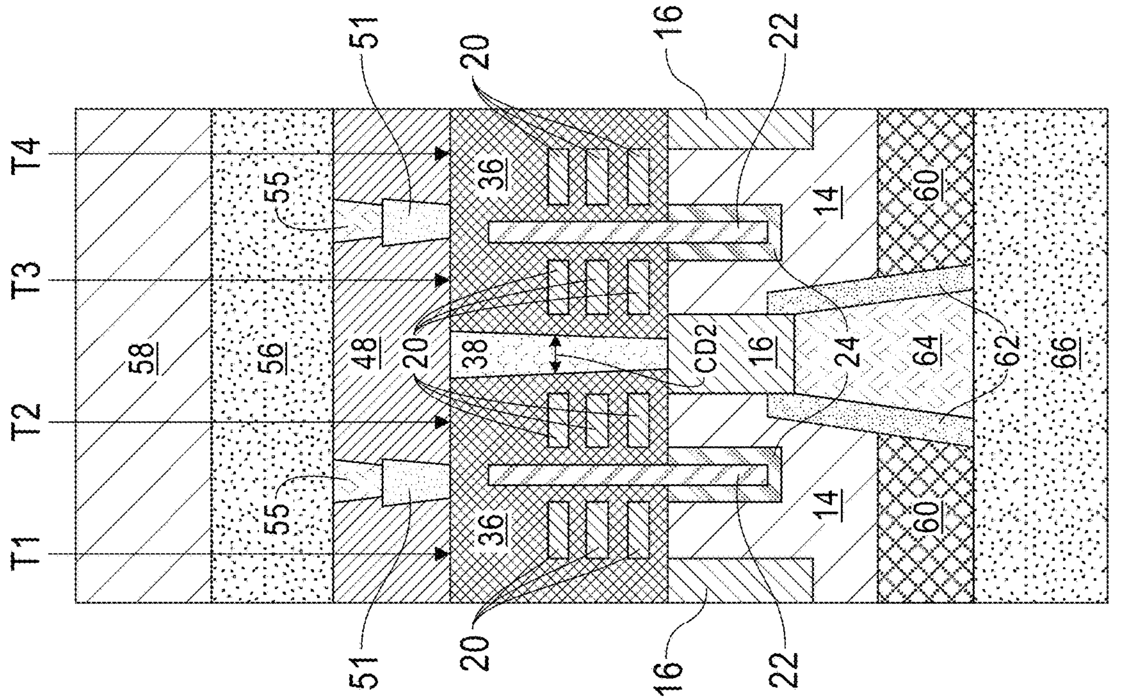
Figure 10C:
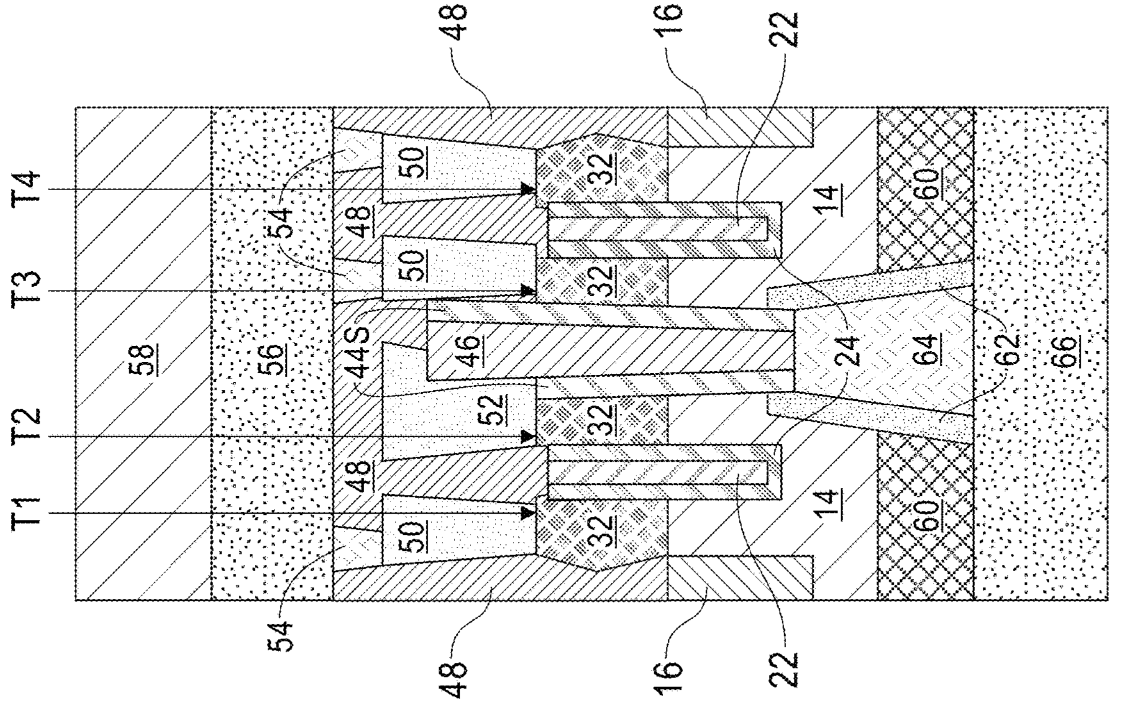

Following the first backside ILD layer 60, the backside power rail structure including backside power rail 64 and backside power rail dielectric liner 62 is formed by a metallization process including a step in which the power via dielectric liner 44 that is located on the bottom wall of the power via 46 is removed. Each remaining portion of the power via dielectric liner 44 can now be referred to a power dielectric spacer 44S; the power dielectric spacers 44S have heights as mentioned above for the original power via dielectric liner 44. A frontside-to-backside power via structure defined by the combination of the power via dielectric spacers 44S and power via 46 is now formed between T2 and T3 and in the non-active device area. As is illustrated in FIGS. 10B and 10C, a power dielectric spacer 44S is located on each side of the power via 46. The power dielectric spacer 44S located on each side of the power via 46 can have a same height between T2 and T3 as is shown in FIG. 10B, while in the source/drain region of T2 and T3, the power dielectric spacer 44S located adjacent to the source/drain region 32 of T2 has a height that is less than the power dielectric spacer 44S located adjacent to the source/drain region 32 of T3. Embodiments are possible in which the power dielectric spacer 44S located adjacent to the source/drain region 32 of T2 has a same height as the power dielectric spacer 44S located adjacent to the source/drain region 32 of T3. Such an embodiment is obtained when the frontside source/drain-power via contact structure 52 is designed to only contact a topmost surface of the power via 46. It is noted that the frontside-to-backside power via structure has a first critical dimension CD1, while the gate cut structure 38 has a second critical dimension CD2, in which CD2 is less than CD1. It is also noted that the frontside-to-backside power via structure is located laterally adjacent to, and is in direct contact with, the gate cut structure 38.

The backside power rail dielectric liner 62 is composed of a dielectric material including the power via dielectric material mentioned above. The backside power rail dielectric liner 62 is formed along the sidewall backside power rail 64. The backside power rail dielectric liner 62 can be a conformal liner. The backside power rail 64 is composed of an electrically conductive power rail material, as defined above. The backside power rail 64 has an upper portion of a first critical dimension and a lower portion of a second critical dimension that is less than the first critical dimension. Hence, the backside power rail 64 has a trapezoidal shape. The upper portion of the backside power rail 64 directly contacts the physically exposed surface of the power via 46 and the lower portion of the of the backside power rail directly contacts a backside power distribution network 66.

Backside power distribution network 66 (also referred to as backside interconnect structure or a backside BEOL structure) is composed of an interconnect dielectric region having backside metal wiring embedded therein. The interconnect dielectric region includes one or more interconnect dielectric material layers. The interconnect dielectric material layers can be composed of one of the ILD materials mentioned above. The backside metal wiring which can be in the form of metal lines, metal vias, a metal via/metal line combination or any combinations thereof is composed of an electrically conductive metal or an electrically conductive metal alloy, as both defined above. The backside power distribution network 66 can be formed utilizing any well-known BEOL process including a damascene process or a subtractive metal etch process.

FIGS. 10A-10D illustrates an exemplary semiconductor device in accordance with the present application. In FIGS.

10B-10B, T1 represents a first nanosheet transistor, T2 represents a first fork sheet transistor, T3 represents a second fork sheet transistor and T4 represents a second nanosheet transistor. In the present application, T1-T2 represent a first pair of transistors of a first cell and T3 and T4 represent a second pair of transistors of a second cell. In embodiments, the second pair of transistors and thus the second cell can be omitted. Notably, FIGS. 10A-10D show a semiconductor device including first fork sheet transistor T2 having a first side located adjacent to first nanosheet transistor T1 and a second side, opposite the first side, located adjacent to, and in direct physical contact with, frontside-to-backside power via structure (i.e., the combination of the power via dielectric spacer 44S and the power via 46). The frontside-to-backside power via structure is electrically connected to backside power distribution network 66. The electrical connection is established by positioning backside power rail 64 in between the frontside-to-backside power via structure and backside power distribution network structure 66. Notably, backside power rail 64 is located between and in electrical contact with both the frontside-to-backside power via structure and the backside power distribution network 66. In the present application, the first fork sheet transistor T2 includes a vertical stack of semiconductor nanosheets 20, and each nanosheet 20 of the vertical stack of nanosheets is in direct physical contact with power via dielectric spacer 44S of the frontside-to-backside power via structure.

In embodiments, the dielectric core 22 separates the fork sheet transistor T2 from the nanosheet transistor T1, and the dielectric liner 24 has a height that is less than the dielectric core 20.

In embodiments, the frontside-to-backside power via structure is located laterally adjacent to, and in contact with, gate cut structure 38. Gate cut structure 38 has a second critical dimension CD2 that is less than a first critical dimension of the frontside-to-backside power via structure.

In embodiments, the fork sheet transistor (i.e. T2) and the nanosheet transistor (i.e., T1) are components of a first cell and a second cell including a second fork sheet transistor (i.e., T3) and second nanosheet transistor (i.e., T4) is located adjacent to, but separated from the first cell by at least the frontside-to-backside power via structure. The second cell can also be separated from first cell by gate cut structure 38. In either case, the second fork sheet transistor (i.e., T3) is in direct contact with the frontside-to-backside power via structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a fork sheet transistor having a first side located adjacent to a nanosheet transistor and a second side, opposite the first side, located adjacent to, and in direct contact with, a frontside-to-backside power via structure; and a backside power distribution network electrically connected to the frontside-to-backside power via structure.

2. The semiconductor device of claim 1, further comprising a backside power rail located between, and in electrical contact with, both the frontside-to-backside power via structure and the backside power distribution network.

3. The semiconductor device of claim 1, further comprising a dielectric structure comprising a dielectric core and a dielectric liner, wherein the dielectric core separates the fork sheet transistor from the nanosheet transistor, and the dielectric liner has a height that is less than the dielectric core.

4. The semiconductor device of claim 3, wherein the fork sheet transistor and the nanosheet transistor share a gate structure, the gate structure extending above the dielectric core of the dielectric structure.

5. The semiconductor device of claim 1, wherein the fork sheet transistor comprises a vertical stack of semiconductor nanosheets, and each nanosheet of the vertical stack of nanosheets is in direct physical contact with a power via dielectric spacer of the frontside-to-backside power via structure.

6. The semiconductor device of claim 1, further comprising a frontside back-end-of-the-line (BEOL) structure in electrical contact with both the fork sheet transistor and the nanosheet transistor.

7. The semiconductor device of claim 1, further comprising a gate cut structure located laterally adjacent to, and in direct contact, with the frontside-to-backside power via structure.

8. The semiconductor device of claim 7, wherein the frontside-to-backside power via structure has a first critical dimension and the gate cut structure has a second critical dimension, wherein the second critical dimension is less than the first critical dimension.

9. The semiconductor device of claim 1, further comprising a frontside source/drain-power via contact structure contacting a source/drain region of the fork sheet transistor.

10. The semiconductor device of claim 9, wherein the frontside source/drain-power via contact structure contacts both a sidewall and a topmost surface of the source/drain region of the fork sheet transistor.

11. The semiconductor device of claim 1, wherein the fork sheet transistor and the nanosheet transistor are components of a first cell and a second cell comprising a second fork sheet transistor and second nanosheet transistor is located adjacent to, but separated from the first cell by at least the frontside-to-backside power via structure, and wherein the second fork sheet transistor is in direct contact with the frontside-to-backside power via structure.

12. A semiconductor device comprising:

a fork sheet transistor having a first side located adjacent to a nanosheet transistor and a second side, opposite the first side, located adjacent to, and in direct contact with, a frontside-to-backside power via structure;

a gate cut structure located laterally adjacent to, and in direct contact, with the frontside-to-backside power via structure, wherein the frontside-to-backside power via structure has a first critical dimension and the gate cut structure has a second critical dimension, wherein the second critical dimension is less than the first critical dimension; and a backside power distribution network electrically connected to the frontside-to-backside power via structure.

13. The semiconductor device of claim 12, further comprising a backside power rail located between, and in electrical contact with, both the frontside-to-backside power via structure and the backside power distribution network.

14. The semiconductor device of claim 12, further comprising a dielectric structure comprising a dielectric core and a dielectric liner, wherein the dielectric core separates the fork sheet transistor from the nanosheet transistor, and the dielectric liner has a height that is less than the dielectric core.

15. The semiconductor device of claim 14, wherein the fork sheet transistor and the nanosheet transistor share a gate structure, the gate structure extending above the dielectric core of the dielectric structure.

16. The semiconductor device of claim 12, wherein the fork sheet transistor comprises a vertical stack of semiconductor nanosheets, and each nanosheet of the vertical stack of nanosheets is in direct physical contact with a power via dielectric spacer of the frontside-to-backside power via structure.

17. The semiconductor device of claim 12, further comprising a frontside back-end-of-the-line (BEOL) structure in electrical contact with both the fork sheet transistor and the nanosheet transistor.

18. The semiconductor device of claim 12, further comprising a frontside source/drain-power via contact structure contacting a source/drain region of the fork sheet transistor.

19. The semiconductor device of claim 18, wherein the frontside source/drain-power via contact structure contacts both a sidewall and a topmost surface of the source/drain region of the fork sheet transistor.

20. The semiconductor device of claim 12, wherein the fork sheet transistor and the nanosheet transistor are components of a first cell and a second cell comprising a second fork sheet transistor and second nanosheet transistor is located adjacent to, but separated from the first cell by the frontside-to-backside power via structure and the gate cut structure, and wherein the second fork sheet transistor is in direct contact with the frontside-to-backside power via structure.

* * * * *